(12) United States Patent
Gyoda et al.

(10) Patent No.: US 8,811,714 B2
(45) Date of Patent: Aug. 19, 2014

(54) METHOD, APPARATUS AND MEDIUM FOR DETERMINING THE INTENSITY DISTRIBUTION FORMED ON A PUPIL PLANE OF AN ILLUMINATION OPTICAL SYSTEM

(75) Inventors: Yuichi Gyoda, Utsunomiya (JP); Hiroyuki Ishii, Shioya-gun (JP); Koji Mikami, Nikko (JP); Youzou Fukagawa, Utsunomiya (JP)

(73) Assignee: Canon Kabushiki Kaisha (JP)

(*) Notice: Subject to any disclaimer, the term of this patent is extended or adjusted under 35 U.S.C. 154(b) by 461 days.

(21) Appl. No.: 13/217,558

(22) Filed: Aug. 25, 2011

(65) Prior Publication Data

US 2012/0051622 A1 Mar. 1, 2012

(30) Foreign Application Priority Data

Sep. 1, 2010 (JP) ................................. 2010-196091

(51) Int. Cl.
*G06K 9/20* (2006.01)
*G06K 9/60* (2006.01)
*G06K 9/64* (2006.01)
*G03F 7/20* (2006.01)

(52) U.S. Cl.
CPC ............ *G03F 7/70091* (2013.01); *G03F 7/705* (2013.01)
USPC ....................................................... 382/144

(58) Field of Classification Search
None
See application file for complete search history.

(56) References Cited

U.S. PATENT DOCUMENTS

| | | | |
|---|---|---|---|
| 8,450,031 B2 * | 5/2013 | Gyoda et al. | 430/30 |
| 2010/0009275 A1 * | 1/2010 | Mikami et al. | 430/30 |
| 2010/0039633 A1 * | 2/2010 | Granik | 355/67 |
| 2011/0096313 A1 * | 4/2011 | Bagheri et al. | 355/67 |
| 2013/0258303 A1 * | 10/2013 | Natt et al. | 355/67 |

FOREIGN PATENT DOCUMENTS

| | | | |
|---|---|---|---|
| JP | 2002261004 A | 9/2002 | |
| JP | 3342631 B | 11/2002 | |
| JP | 2004247737 A * | 9/2004 | ............ H01L 21/027 |
| JP | 4378266 B | 12/2009 | |

OTHER PUBLICATIONS

Matsuyama, et al., "A Study of Source and Mask Optimization for ArF Scanners", Optical Microlithography XXII, SPIE vol. 7274, 2009, pp. 1-8.

* cited by examiner

*Primary Examiner* — Brian P Werner
(74) *Attorney, Agent, or Firm* — Rossi, Kimms & McDowell LLP

(57) ABSTRACT

The present invention provides a determination method of determining a light intensity distribution to be formed on a pupil plane of an illumination optical system in an exposure apparatus, the method including a step of setting a cutline used to evaluate an image of a pattern of a mask, which is formed on an image plane of a projection optical system, and a target position of the image, and a step of determining an intensity of an element light source such that the position of a midpoint between edges of the image of the pattern of the mask on the cutline from a calculated image comes close to the target position, thereby determining the light intensity distribution.

11 Claims, 17 Drawing Sheets

FIG. 3

| | | | | | R1 | R2 | R3 | R4 | R5 | | | | | |
|---|---|---|---|---|---|---|---|---|---|---|---|---|---|---|
| | | | R6 | R7 | R8 | R9 | R10 | R11 | R12 | R13 | R14 | | | |
| | | R15 | R16 | R17 | R18 | R19 | R20 | R21 | R22 | R23 | R24 | R25 | | |
| | R26 | R27 | R28 | R29 | R30 | R31 | R32 | R33 | R34 | R35 | R36 | R37 | R38 | |
| | R39 | R40 | R41 | R42 | R43 | R44 | R45 | R46 | R47 | R48 | R49 | R50 | R51 | |
| R52 | R53 | R54 | R55 | R56 | R57 | R58 | R59 | R60 | R61 | R62 | R63 | R64 | R65 | R66 |
| R67 | R68 | R69 | R70 | R71 | R72 | R73 | R74 | R75 | R76 | R77 | R78 | R79 | R80 | R81 |
| R82 | R83 | R84 | R85 | R86 | R87 | R88 | R89 | R90 | R91 | R92 | R93 | R94 | R95 | R96 |
| R97 | R98 | R99 | R100 | R101 | R102 | R103 | R104 | R105 | R106 | R107 | R108 | R109 | R110 | R111 |
| R112 | R113 | R114 | R115 | R116 | R117 | R118 | R119 | R120 | R121 | R122 | R123 | R124 | R125 | R126 |
| | R127 | R128 | R129 | R130 | R131 | R132 | R133 | R134 | R135 | R136 | R137 | R138 | R139 | |
| | R140 | R141 | R142 | R143 | R144 | R145 | R146 | R147 | R148 | R149 | R150 | R151 | R152 | |
| | | R153 | R154 | R155 | R156 | R157 | R158 | R159 | R160 | R161 | R162 | R163 | | |
| | | | R164 | R165 | R166 | R167 | R168 | R169 | R170 | R171 | R172 | | | |
| | | | | | R173 | R174 | R175 | R176 | R177 | | | | | |

F I G. 5
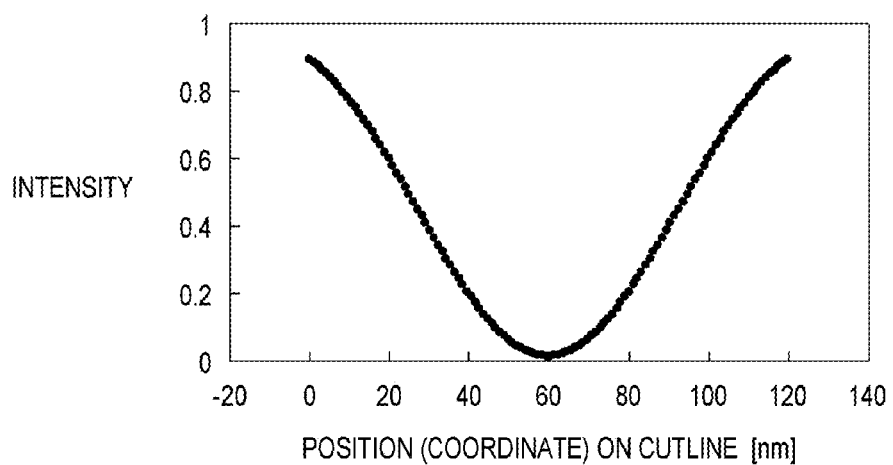
F I G. 6
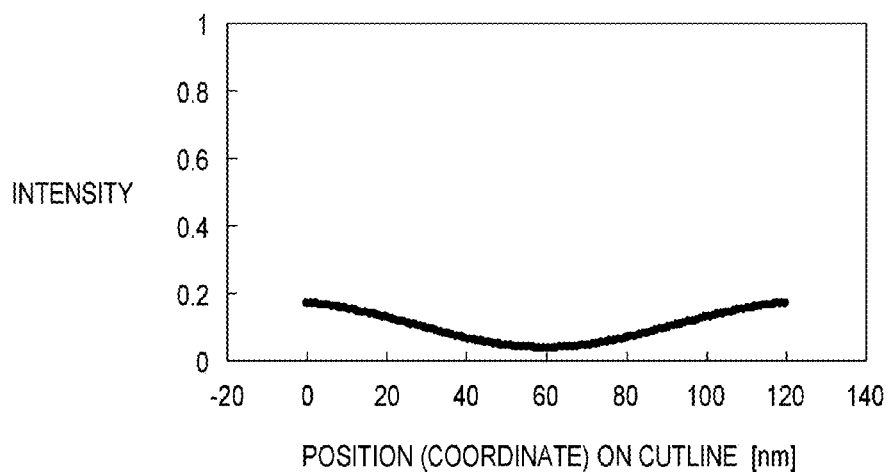

F I G. 16
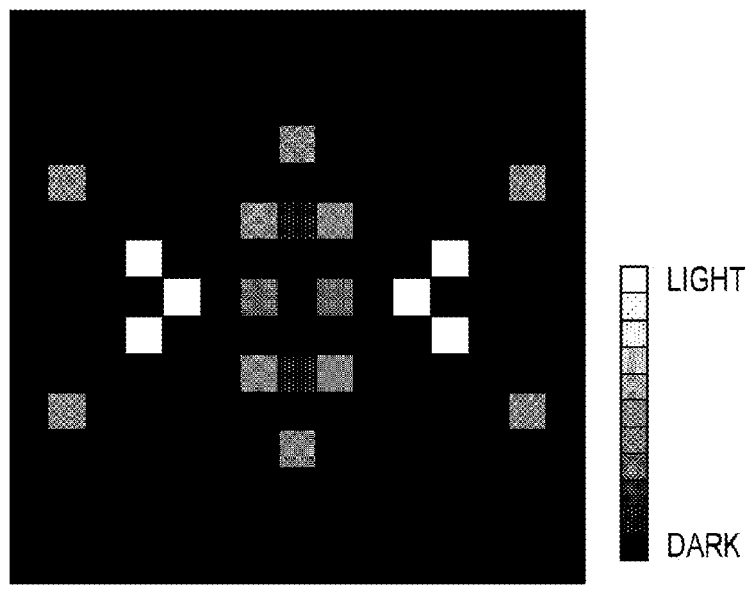

METHOD, APPARATUS AND MEDIUM FOR DETERMINING THE INTENSITY DISTRIBUTION FORMED ON A PUPIL PLANE OF AN ILLUMINATION OPTICAL SYSTEM

BACKGROUND OF THE INVENTION

1. Field of the Invention

The present invention relates to a determination method of determining a light intensity distribution (effective light source) to be formed on the pupil plane of an illumination optical system, an exposure method, and a storage medium.

2. Description of the Related Art

An exposure apparatus is employed to fabricate a semiconductor device using a photolithography technique. The exposure apparatus projects and transfers the pattern of a mask (reticle) onto a substrate (for example, a wafer) by a projection optical system. To keep up with the recent advances in micropatterning of semiconductor devices, the exposure apparatus requires a technique of attaining a high resolution.

Because an exposure apparatus cannot always ensure an ideal amount of exposure on the substrate and an ideal focus position, it may transfer a pattern different from that having a desired shape (mask pattern shape) onto a substrate. The amount of exposure deviates from an ideal state due to factors such as instability of a light source and nonuniformity of the illuminance distribution in an illumination region. Also, the focus position deviates from an ideal state due to factors such as instability of the holding position of the substrate and unevenness of the substrate. A model defined by the ranges of amounts of exposure and focus positions, within which a desired pattern can be transferred onto the substrate, is called a process window, and the exposure apparatus requires a technique of attaining a wide process window.

Oblique-incidence illumination, for example, is known as a technique for attaining both a high resolution and a wide process window. In the oblique-incidence illumination, a mask is obliquely irradiated with exposure light using an annular effective light source (the light intensity distribution on the pupil plane of an illumination optical system) or an effective light source with a shape having a plurality of (for example, two or four) poles. The annular effective light source is defined by two degrees of freedom (parameters): the annular zone radius and the annular zone width. Thus, the following technique has been proposed. Pattern images for effective light sources defined by those two degrees of freedom are obtained by simulation while changing them to various values, and an annular zone radius and an annular zone width are selected based on these pattern images, thereby determining an optimum effective light source.

Also, in recent years, T. Matsuyama, et. al., "A Study of Source & Mask Optimization for ArF Scanners", Proc. of SPIE, USA, SPIE, 2009, Vol. 7,274, p. 727,408 (literature 1), proposes a technique which increases the number of degrees of freedom which define the effective light source. In the technique described in literature 1, the pupil plane of an illumination optical system is divided into a plurality of regions in a grid pattern, and light intensities are individually set for the respective divided regions. However, assuming, for example, that the pupil plane of the illumination optical system is divided into 63×63 regions, a thousand or more degrees of freedom are determined. From the viewpoint of the computation time, it is not realistic to obtain pattern images for respective combinations of degrees of freedom defined within such a wide optimization space to determine an optimum effective light source. Although Japanese Patent No. 3342631 proposes a heuristic optimization technique of adjusting the initial value and iterating computation to obtain an optimum solution, this technique may not only require a long computation time but also result in a local solution.

On the other hand, Japanese Patent No. 4378266 proposes a technique which uses mathematical programming in effective light source optimization with such large degrees of freedom. The mathematical programming mathematically guarantees its solution to be optimum, and can shorten the computation time.

The technique described in Japanese Patent No. 4378266 is designed to apply approximation to a maximization problem for the process window to transform this problem into one type of mathematical programming, that is, a linear programming problem to be solved, thereby obtaining a solution. The process window is generally the product of the range of amounts of exposure and that of focus positions, within which the width of a pattern image falls within a tolerance. In the technique described in Japanese Patent No. 4378266, the positions of the two side edges of a line pattern image are defined, and the effective light source is optimized under this condition.

Unfortunately, the technique described in Japanese Patent No. 4378266 often cannot optimize the effective light source. A case in which, for example, a mask pattern is formed by equidistantly arranging three line patterns having the same size will be considered. In this case, when attention is focused on the central line pattern, the position (midpoint position) of the central line pattern and that of an image corresponding to this central line pattern coincide with each other unless asymmetric aberrations such as coma and distortion are present. On the other hand, when attention is focused on the line pattern at each end, a difference occurs between the position of the line pattern at each end and that of an image corresponding to this line pattern at each end due to an optical proximity effect even if no asymmetric aberrations are present. The difference between the position of a pattern and that of an image corresponding to this pattern is called a pattern shift, which generally occurs for most patterns. In the technique described in Japanese Patent No. 4378266, the position coordinates of the two edges of the image of the line pattern are fixed, and an effective light source is obtained such that the two edges of the image of the line pattern are positioned at these position coordinates, so this technique does not take the concept of a pattern shift into consideration. Therefore, when a pattern shift occurs, the technique described in Japanese Patent No. 4378266 cannot be used to determine an optimum effective light source.

Also, with advances in micropatterning of semiconductor devices, the occurrence of a pattern shift may have a more serious influence on the yield (throughput). A mask for an ion implantation process in an SRAM will be considered as an example. This mask has a simple line-and-space pattern, which has a relatively large pitch of several hundred nanometers. In a mask of this type, a demand for the line width of its pattern is not so strict, but the overlay accuracy on an isolation oxide layer present in the underlying layer is of prime importance in an ion implantation process, so a demand for a pattern shift is strict. Therefore, the effective light source must be optimized (determined) such that the amount of pattern shift for the mask pattern falls within a tolerance.

SUMMARY OF THE INVENTION

The present invention provides a technique advantageous to determine a light intensity distribution to be formed on the pupil plane of an illumination optical system.

According to one aspect of the present invention, there is provided a determination method of determining a light intensity distribution to be formed on a pupil plane of an illumination optical system which illuminates a mask in an exposure apparatus including the illumination optical system and a projection optical system which projects a pattern of the mask onto a substrate, the method, performing the following steps by a computer, including a first step of setting the pattern of the mask, a second step of setting a cutline used to evaluate an image of the pattern of the mask, which is formed on an image plane of the projection optical system, and a target position of the image, a third step of setting a plurality of element light sources which form on the pupil plane of the illumination optical system, a fourth step of calculating an image of the pattern of the mask, which is formed on the cutline upon illuminating the pattern of the mask, for each of the plurality of element light sources, and a fifth step of determining an intensity of the element light source such that the position of a midpoint between edges of the image of the pattern of the mask on the cutline from the calculated image comes close to the target position, thereby determining the light intensity distribution.

Further features of the present invention will become apparent from the following description of exemplary embodiments with reference to the attached drawings.

BRIEF DESCRIPTION OF THE DRAWINGS

FIG. 3 is a view for explaining element light sources generated in step S110 of the flowchart shown in FIG. 1.

FIG. 5 is a graph for explaining the intensity distribution of an optical image calculated in step S112 of the flowchart shown in FIG. 1.

FIG. 6 is a graph for explaining the intensity distribution of an optical image calculated in step S112 of the flowchart shown in FIG. 1.

FIG. 16 is a view showing the effective light source determined in step S114 of the flowchart shown in FIG. 1.

DESCRIPTION OF THE EMBODIMENTS

Figure 1:
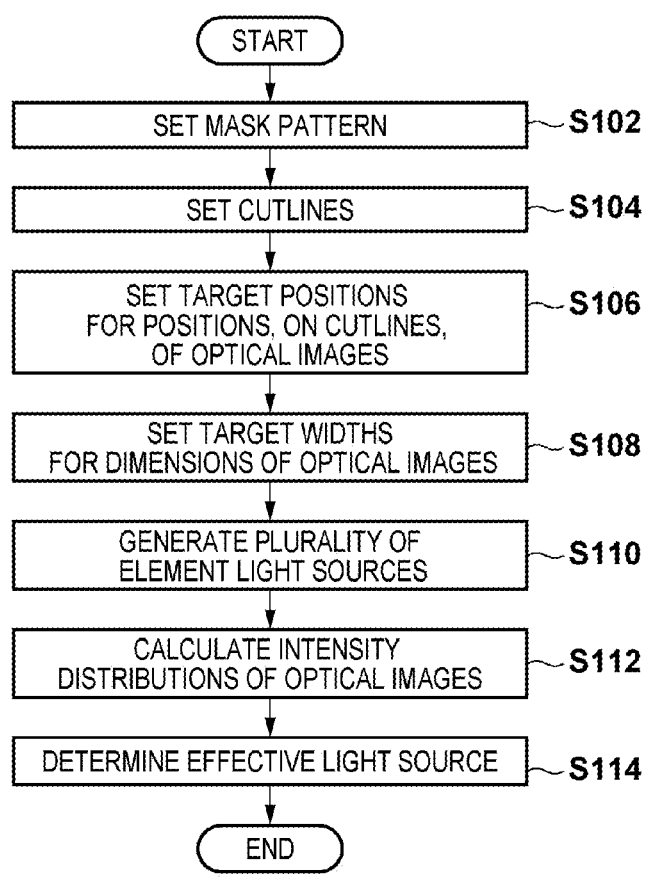
FIG. 1 is a flowchart for explaining a determination method according to an aspect of the present invention.

Preferred embodiments of the present invention will be described below with reference to the accompanying drawings. Note that the same reference numerals denote the same members throughout the drawings, and a repetitive description thereof will not be given.

The present invention is applicable to determination of an effective light source used in micromechanics and in fabricating various devices such as a semiconductor chip such as an IC or an LSI, a display device such as a liquid crystal panel, a detection device such as a magnetic head, and an image sensing element such as a CCD. The micromechanics means herein a technique of creating a micron-scale machinery system with sophisticated functions by applying a semiconductor integrated circuit fabrication technique to microstructure fabrication, or the machinery system itself.

First Embodiment

FIG. 1 is a flowchart for explaining a determination method according to an aspect of the present invention. The determination method in this embodiment is executed by an information processing apparatus such as a computer to determine (optimize) an effective light source used to illuminate a mask (reticle) in an exposure apparatus including an illumination optical system which illuminates the mask, and a projection optical system which projects the pattern of the mask onto a substrate. The effective light source means herein a light intensity distribution formed on the pupil plane of the projection optical system while no mask is placed on the object plane of the projection optical system. Therefore, determining an effective light source amounts to determining a light intensity distribution to be formed on the pupil plane of the illumination optical system.

Figure 2:
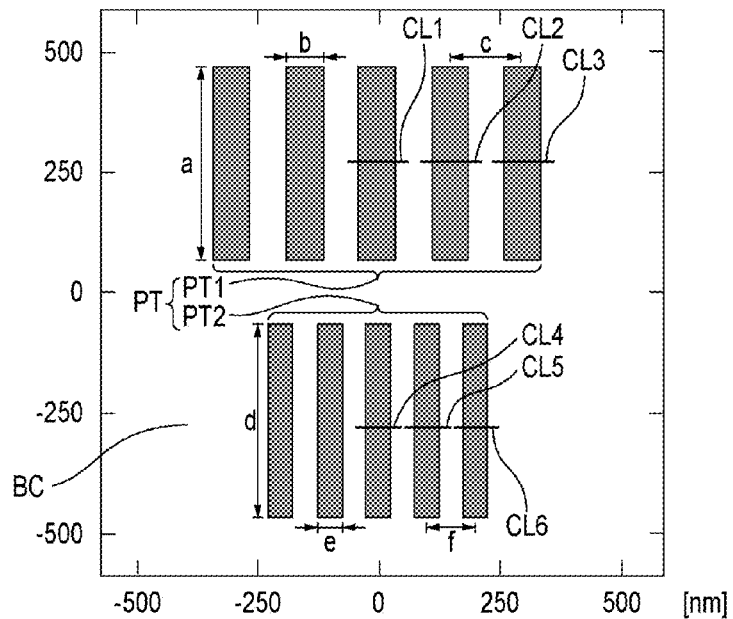
FIG. 2 is a view illustrating an example of a mask pattern set in step S102 of the flowchart shown in FIG. 1.

In step S102, the pattern (mask pattern) of a mask to be placed on the object plane of the projection optical system is set. In this embodiment, a mask pattern including pattern groups PT formed from light-shielding portions, and a background portion BC formed from a light-transmitting portion is set, as shown in FIG. 2. This mask pattern includes two types of line-and-space patterns: a first pattern portion PT1 and a second pattern portion PT2. Line patterns which form the first pattern portion PT1 have a longitudinal dimension a of 400 nm, a widthwise dimension b of 75 nm, and a pitch c of 150 nm. Also, line patterns which form the second pattern portion PT2 have a longitudinal dimension d of 400 nm, a widthwise dimension e of 50 nm, and a pitch f of 100 nm. A mask pattern generally includes various patterns. In step S102, either all types of patterns or necessary patterns included in the mask pattern may be set. Also, although a two-dimensional mask pattern is set in this embodiment, a one- or three-dimensional mask pattern may be set.

In step S104, cutlines (portions of interest) used to evaluate optical images (images formed on the image plane of the projection optical system) of the mask pattern set in step S102 are set. In this embodiment, cutlines CL1, CL2, and CL3 are set in portions on the image plane of the projection optical system, which correspond to the central portions of three line patterns, respectively, among five line patterns which form the first pattern portion PT1 (see FIG. 2). Similarly, cutlines CL4, CL5, and CL6 are set in portions on the image plane of the projection optical system, which correspond to the central portions of three line patterns, respectively, among five line patterns which form the second pattern portion PT2 (see FIG. 2). Note that in this embodiment, attention is focused on the widthwise dimension of each line pattern, so a cutline is set in the widthwise direction of this line pattern. In contrast, when attention is focused on the longitudinal dimension of each line pattern, a cutline need only be set in the longitudinal direction of this line pattern. Also, when attention is focused on the distance between adjacent line patterns, a cutline need only be set so as to run across these adjacent line patterns. Note that FIG. 2 shows setting of cutlines for the mask pattern assuming that the dimension on the object plane of the projection optical system and that on the image plane of the projection optical system are equal to each other (that is, the projection optical system has unit magnification) for the sake of descriptive simplicity. However, in practice, cutlines must be set on the image plane of the projection optical system in consideration of a mask pattern having a dimension corresponding to that on the image plane, based on the magnification of the projection optical system.

Optical images formed on the cutlines CL1 and CL4 set for the central line patterns generate no pattern shifts unless a bilaterally asymmetric aberration or a bilaterally asymmetric effective light source is produced. Therefore, the position of the optical image corresponding to each central line pattern coincides with that of this central line pattern. On the other hand, optical images formed on the cutlines CL3 and CL6 set for the endmost line patterns generate pattern shifts due to an optical proximity effect even if a bilaterally symmetric aberration and a bilaterally symmetric effective light source are produced. Therefore, an optical image corresponding to each endmost line pattern is formed at a position shifted horizontally with respect to that of this endmost line pattern, so the position of the optical image corresponding to each endmost line pattern does not always coincide with that of this endmost line pattern.

In step S106, target positions for the positions, on the cutlines, of the optical images of the mask pattern, which are formed on the cutlines set in step S104, are set. In this embodiment, the position (midpoint position) of the midpoint of the optical image of the mask pattern is assumed as a physical quantity representing the position of the optical image of the mask pattern. Note that the midpoint position means the position (coordinate) of the middle between the position of the left and right edges in an optical image of the mask pattern, which is formed on a given cutline. Therefore, in this embodiment, a target position for the midpoint position between the edges, on each cutline, of the optical image of the mask pattern is set. If the midpoint position of the mask pattern coincides with that of the optical image corresponding to this mask pattern, no pattern shift is expected to have occurred. On the other hand, if the midpoint position of the mask pattern does not coincide with that of the optical image corresponding to this mask pattern, a pattern shift is expected to have occurred.

In cutline setting (S104) in this embodiment, midpoints of the cutlines CL1 to CL6 are set to coincide with those of the line patterns, respectively. Because the lengths of the cutlines CL1 to CL3 are set to 120 nm, a position 60 nm from the edge, which is defined by the position (coordinate) on each cutline, is the midpoint position of the corresponding line pattern (mask pattern). Also, because the lengths of the cutlines CL4 to CL6 are set to 90 nm, a position 45 nm from the edge, which is defined by the position (coordinate) on each cutline, is the midpoint position of the corresponding line pattern (mask pattern). In this embodiment, an effective light source which minimizes the amount of pattern shift is determined, so positions, defined on the cutlines CL1 to CL6, which coincide with the midpoint positions of the line patterns, respectively, are set as target positions. More specifically, a target position for the midpoint position between the edges, on a given cutline, of the optical image of the mask pattern is set for each of the cutlines CL1 to CL6, as shown in Table 1.

TABLE 1

| | Cutline | | | | | |
|---|---|---|---|---|---|---|
| | CL1 | CL2 | CL3 | CL4 | CL5 | CL6 |
| Target Position [nm] | 60 | 60 | 60 | 45 | 45 | 45 |
| Target Width [nm] | 75 | 75 | 75 | 50 | 50 | 50 |

In this embodiment, the midpoint position of the optical image of the mask pattern is used as a physical quantity representing the position of this optical image, as described above. However, the physical quantity representing the position of the optical image of the mask pattern is not limited to the midpoint position of this optical image, and any physical quantity can be used as long as it uniquely determines the position of the optical image for the amount of pattern shift without fixing the positions of the two edges of the optical image.

In step S108, target widths (target dimension values) for the dimensions of the optical images of the mask pattern, which are formed on the cutlines set in step S104, are set. In this embodiment, target widths for the widthwise dimensions (line widths) of optical images of the mask pattern, which are formed on the cutlines CL1 to CL6, respectively, are set, as shown in Table 1.

To optimize the effective light source, it is a common practice to take the amounts of pattern shift and the line widths of the optical images of the mask pattern into consideration. In this embodiment as well, by setting target widths for the line widths (dimensions), on the cutlines, of the optical images of the mask pattern, an effective light source can be determined in consideration of not only the amounts of pattern shift but also the line widths of the optical images. However, when the line widths of the optical images of the mask pattern need not be taken into consideration, there is no need to set target widths for the line widths, on the cutlines, of the optical images of the mask pattern, so step S108 may be omitted.

In step S110, a plurality of different element light sources to be formed on the pupil plane of the illumination optical system are generated. In this embodiment, the pupil plane of the illumination optical system is divided into a plurality of regions R1 to R177 in a grid pattern, and only one of these plurality of regions R1 to R177 is illuminated to generate it as an element light source, as shown in FIG. 3. Note that in FIG. 3, a circle indicated by a dotted line represents a circle with a coherence factor of 1.

Figure 4A:
FIGS. 4A and 4B are views for explaining the element light sources generated in step S110 of the flowchart shown in FIG. 1.
Figure 4B:
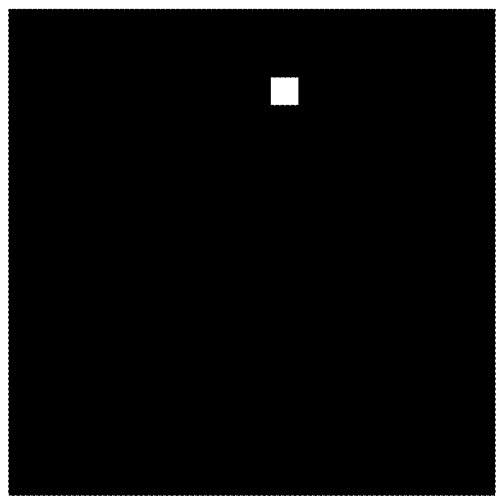

FIGS. 4A and 4B illustrate examples of the plurality of element light sources generated in step S110. FIG. 4A shows an element light source obtained by illuminating only the region R96, and FIG. 4B shows an element light source obtained by illuminating only the region R21. As described above, in this embodiment, only one of the plurality of regions R1 to R177 is illuminated to generate it as an element light source, so 177 element light sources are generated. The linear sum (a light source obtained by combining the plurality of element light sources) of the plurality of element light sources generated in step S110 is finally determined as an effective light source.

Although the pupil plane of the illumination optical system is divided in a grid pattern in this embodiment, it may be divided in another shape such as an arcuated shape. Also, although each divided region is illuminated one by one to generate it as one element light source in this embodiment, a set of a plurality of regions may be illuminated at once to generate them as one element light source.

In step S112, optical images (their intensity distributions) of the mask pattern, which are formed on the cutlines set in step S104 upon illuminating the mask pattern with each of the plurality of element light sources generated in step S110, are calculated for each of the plurality of element light sources. Note that the intensity of an optical image (aerial image) means the amount of light which reaches one arbitrary point on the substrate under a certain exposure condition. The intensity distribution of an optical image can be calculated using, for example, an optical simulator.

FIG. 5 is a graph showing the intensity distribution of an optical image formed on the cutline CL1 upon illuminating the mask pattern shown in FIG. 2 with the element light source shown in FIG. 4A. Also, FIG. 6 is a graph showing the intensity distribution of an optical image formed on the cutline CL1 upon illuminating the mask pattern shown in FIG. 2 with the element light source shown in FIG. 4B. FIGS. 5 and 6 show the position (coordinate) on the cutline on the abscissa, and the intensity of the optical image at each position on the cutline on the ordinate. The intensity distribution of one optical image is formed from a finite number (241) of light intensity data, and includes light intensity data at positions on the cutline, which shift from each other in steps of (at an interval of) 0.5 nm, as shown in FIGS. 5 and 6. In this case, each position on the cutline, at which light intensity data is present, will be referred to as a grid hereinafter, and let $\Delta x$ be the interval between adjacent positions on the cutline, at which light intensity data are present. As the interval $\Delta x$ reduces, the accuracy of calculation of an optical image (its intensity distribution) by an optical simulator improves, but the number of data undesirably increases. Therefore, the interval $\Delta x$ is about 0.5 nm to 1 nm.

In this embodiment, the intensity distribution of an optical image formed on each of the six cutlines CL1 to CL6 set in step S104 is calculated for each of the 177 element light sources generated in step S110, that is, the intensity distributions of 1,062 optical images are calculated. Note that the intensity distribution of the optical image may take any form as long as it is linear with respect to the intensity of the element light source. For example, to obtain an image corresponding to a resist image, the optical image (its intensity distribution) is often convolved with a Gaussian function describing diffusion of an acid in a resist, such an image is linear with respect to the intensity of the element light source, and is therefore included in the optical image in this embodiment.

In step S114, an effective light source is determined based on the optical images (their intensity distributions) calculated in step S112. More specifically, a weight (light emission intensity) to be applied to each of the plurality of element light sources is determined such that the midpoint positions between the edges, on the cutlines, of the optical images of the mask pattern come close to their target values, thereby determining, as an effective light source, a light source obtained by combining the plurality of element light sources applied with the weights. In other words, the ratio between the light emission intensities of the plurality of element light sources (the 177 element light sources in this embodiment) generated in step S110 is determined to determine an effective light source.

Figure 7:
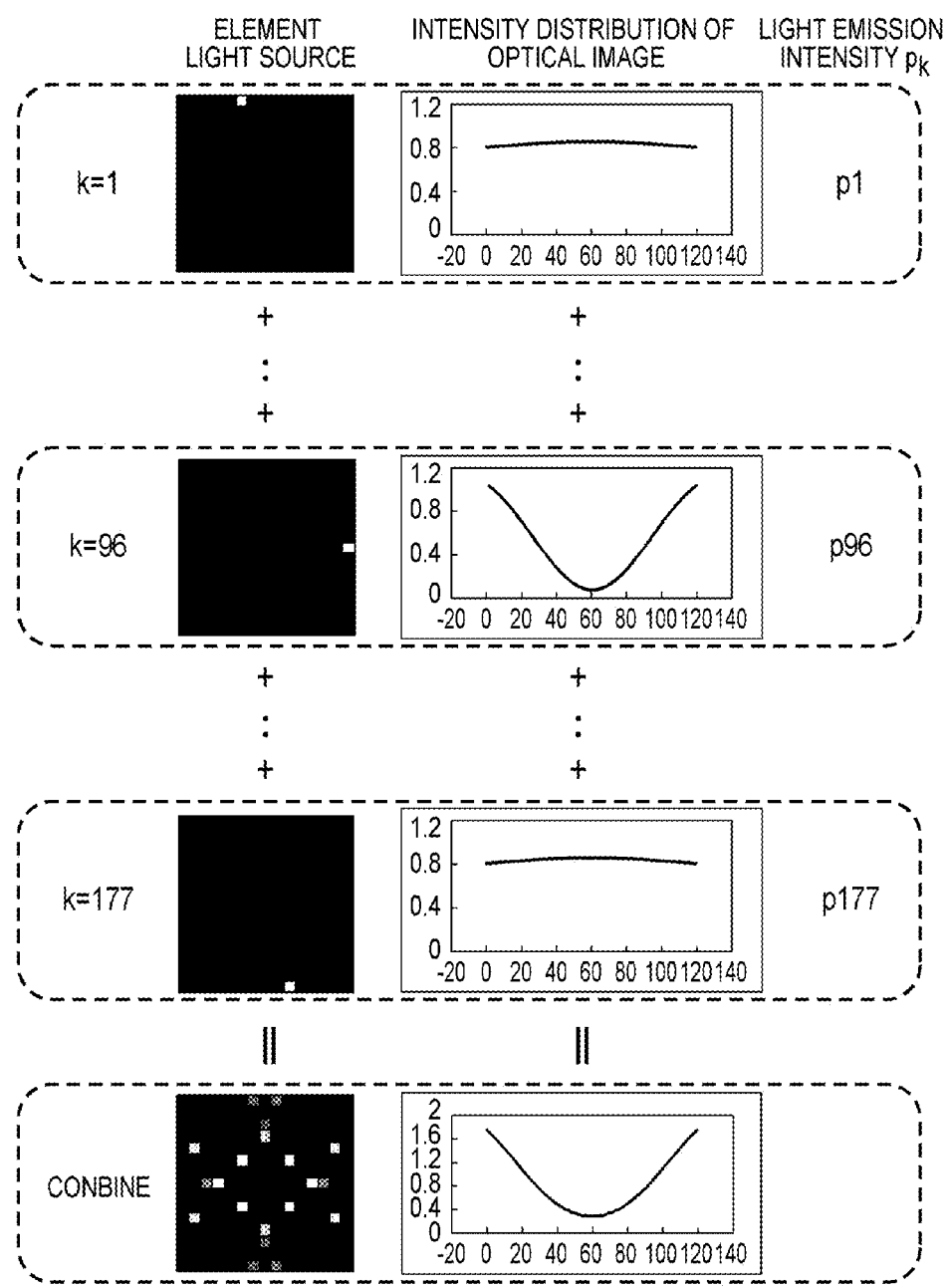
FIG. 7 is a view for explaining determination of an effective light source in step S114 of the flowchart shown in FIG. 1.

An overview of determination of an effective light source (S114) in this embodiment will be described with reference to FIG. 7. FIG. 7 is a view showing the relationship among the element light sources generated in step S110, the intensity distributions of the optical images calculated in step S112, and the light emission intensities $p_k$ (k=1 to 177) of the element light sources determined in step S114.

In the cutline of interest, an intensity distribution obtained by weighting and combining the intensity distributions of the optical images corresponding to the 177 element light sources, respectively, is determined as the intensity distribution of an optical image for an effective light source to be determined finally. Weights (light emission intensities) to be applied to the 177 element light sources are determined such that the intensity distribution obtained by weighting and combining the intensity distributions of the optical images satisfies the target positions of the positions of the optical images set in step S106 (and the target widths of the line widths of the optical images set in step S108). In other words, changing the weight to be applied to each of the plurality of element light sources makes it possible to change the intensity distribution of an optical image corresponding to a final effective light source. Such a technique is based on the Abbe's formula, which is known to those skilled in the art. The Abbe's formula is used as well in the technique described in, for example, Japanese Patent No. 4378266.

As described above, the intensity of an optical image corresponding to the position of interest upon illuminating the mask pattern with a given effective light source is calculated by applying the weights (light emission intensities) of a plurality of element light sources to the intensity values of optical images corresponding to these element light sources, respectively, and combining these element light sources. It can easily be determined based on such a linear law whether a given position in an optical image formed using a given effective light source is a light point or a dark point. In, for example, Japanese Patent No. 4378266, the light/dark state of the optical image is defined for each of a plurality of positions to optimize the effective light source because a linear law easily holds true for the intensity of the optical image with respect to the position.

On the other hand, the amount of pattern shift of the optical image is a physical quantity that is highly nonlinear with respect to the effective light source. In an optical image of a pattern which generates a pattern shift, the amount of pattern shift of the optical image and the light/dark state of the optical image at each position have no one-to-one correspondence between them. Therefore, it is very difficult to apply the prior arts which use linear programming to such a nonlinear problem.

Hence, in this embodiment, the above-mentioned nonlinear problem is formulated using mixed integer programming as presented in:

Expression Group 1

Minimization: $t$ \hfill (1)

Constraints:

$$\sum_{k=1}^{m} I_{ijk} p_k > u_{ij} \; \forall \, i, \forall \, j \quad (2)$$

$$\sum_{k=1}^{m} I_{ijk} p_k < (1 - u_{ij}) + M u_{ij} \forall \, i, \forall \, j \quad (3)$$

$$\left| \sum_{i=1}^{A_j} (1 - u_{ij}) - \sum_{i=B_j}^{L_j} (1 - u_{ij}) \right| \le t \; \forall \, j \quad (4)$$

$$\left| \sum_{i=1}^{L_j} (1 - u_{ij}) - W_j \right| \le t \; \forall \, j \quad (5)$$

$$u_{ij} \ge u_{(i+1)j} \; i \in \{i \,|\, 1 \le i \le A_j - 1\}, \; \forall \, j \quad (6)$$

$$u_{ij} \le u_{(i+1)j} \; i \in \{i \,|\, B_j \le i \le L_j - 1\}, \; \forall \, j \quad (7)$$

$$p_k \ge 0 \; k = 1, \ldots, m \quad (8)$$

$$t \ge 0 \quad (9)$$

$$u_{ij} \in \{0, 1\} \; \forall \, i, \forall \, j \quad (10)$$

Definition of Constants:

$$L_j = \mathrm{Max}(i) \; \forall \, j \quad (11)$$

$$W_j = \mathrm{Int}\left(\frac{\mathrm{Width}_j}{\Delta x} + 0.5\right) \forall \, j \quad (12)$$

$$m = \mathrm{Max}(k) \quad (13)$$

where $p_k$ ($k=1, 2, \ldots, m$) is a decision variable, u and t are dummy variables for control, and I, W, A, B, L, m, M, Width, and $\Delta x$ are constants. The variable $p_k$ representing the light emission intensity (weight) of each element light source is to be obtained finally.

With this process, an effective light source optimization problem which directly evaluates a pattern shift of the optical image can be solved using mathematical programming.

The greatest feature of expression group 1 lies in that the value u as presented in expression (10) is introduced. The value u is a variable which takes a first integer value if the intensity of the optical image exceeds a threshold, and takes a second integer value if the intensity of the optical image does not exceed the threshold, and is a binary variable which takes 0 or 1 in this embodiment. Therefore, the problem defined by expression group 1 is a mixed integer programming problem (MIP problem). The mixed integer programming problem can easily be solved using a commercially available solver such as CPLEX developed by ILOG, Inc. More specifically, inputting, into the solver, expression (1) as an objective function for minimization, and expressions (2) to (10) as constraints and boundary conditions, makes it possible to obtain a solution which minimizes the variable t presented in expression (1), among combinations of the variables which simultaneously satisfy the conditions presented in expressions (2) to (10).

The meaning of each expression in expression group 1 will be explained. Expressions (2) and (3) are associated with the intensity of the optical image. $I_{ijk}$ in each of the left-hand sides of expressions (2) and (3) is the intensity of the optical image calculated in step S112, and means the intensity value, at the i-th position, of an optical image formed on the j-th cutline upon illuminating the k-th element light source at a unit amount of light. In this embodiment, six cutlines are present, so j takes values from 1 to 6. i is a number which starts from 1 and is sequentially assigned to each grid position in the intensity distribution of the optical image formed on the cutline. In this embodiment, the intensity of the optical image is obtained at an interval of 0.5 nm ($\Delta x$), so i takes values from 1 to 241 for a cutline having a length of 120 nm. $L_j$ is the maximum value of i (see expression (11)). k is a number (element light source number) assigned to each element light source. In this embodiment, 177 element light sources are generated, so k takes values from 1 to 177. m is the maximum value of k, that is, the total number of element light sources (see expression (13)).

As can be seen from the foregoing description, the value obtained by combining the light intensities, at the i-th positions, of optical images formed on the j-th cutlines upon illuminating the k-th (k=1, 2, ..., 177) element light sources at the light emission intensities $p_k$ is $\Sigma I_{ijk} p_k$. Note that the light emission intensity $p_k$ has a nonnegative real number (see expression (8)).

The intensity value of the optical image, which serves as a threshold for determination as to whether the resist can be developed upon developing the substrate, is called a slice level. Assuming that the slice level is "1", a positive resist satisfies:

Condition (A): if $\Sigma I_{ijk} p_k > 1$, the resist dissolves upon development, Condition (B): if $\Sigma I_{ijk} p_k < 1$, the resist remains behind upon development.

Although a case in which the resist used is a positive resist will be taken as an example in this embodiment, the resist used may be a negative resist, as a matter of course. Note that when the resist used is a negative resist, it remains behind upon development if $\Sigma I_{ijk} p_k > 1$, and it dissolves upon development if $\Sigma I_{ijk} p_k < 1$.

The relationship between expressions (2) and (3) and the variable $u_{ij}$ defined by expression (10) will be described. For example, if $\Sigma I_{ijk} p_k < 1$, the condition presented in expression (2) cannot be satisfied when the variable $u_{ij}$ takes 1. On the other hand, if $\Sigma I_{ijk} p_k > 1$, the condition presented in expression (2) can be satisfied regardless of whether the variable $u_{ij}$ takes 0 or 1.

M in expression (3) symbolizes a "large value" and naturally takes a large value (for example, 10 or 20) which is not the normal intensity value of the optical image. In this embodiment, M is 50. Hence, if $\Sigma I_{ijk} p_k > 1$, the condition presented in expression (3) cannot be satisfied when the variable $u_{ij}$ takes 0; or if $\Sigma I_{ijk}p_k<1$, the condition presented in expression (3) can be satisfied regardless of the value of the variable $u_{ij}$. Therefore, $\Sigma I_{ijk}p_k$ and $u_{ij}$ have a relation:

$$u_{ij} = \begin{cases} 1 & \text{if } \left(\sum_{k=1}^{m} I_{ijk} p_k > 1\right) \\ 0 & \text{if } \left(\sum_{k=1}^{m} I_{ijk} p_k < 1\right) \end{cases} \quad (14)$$

Figure 8:
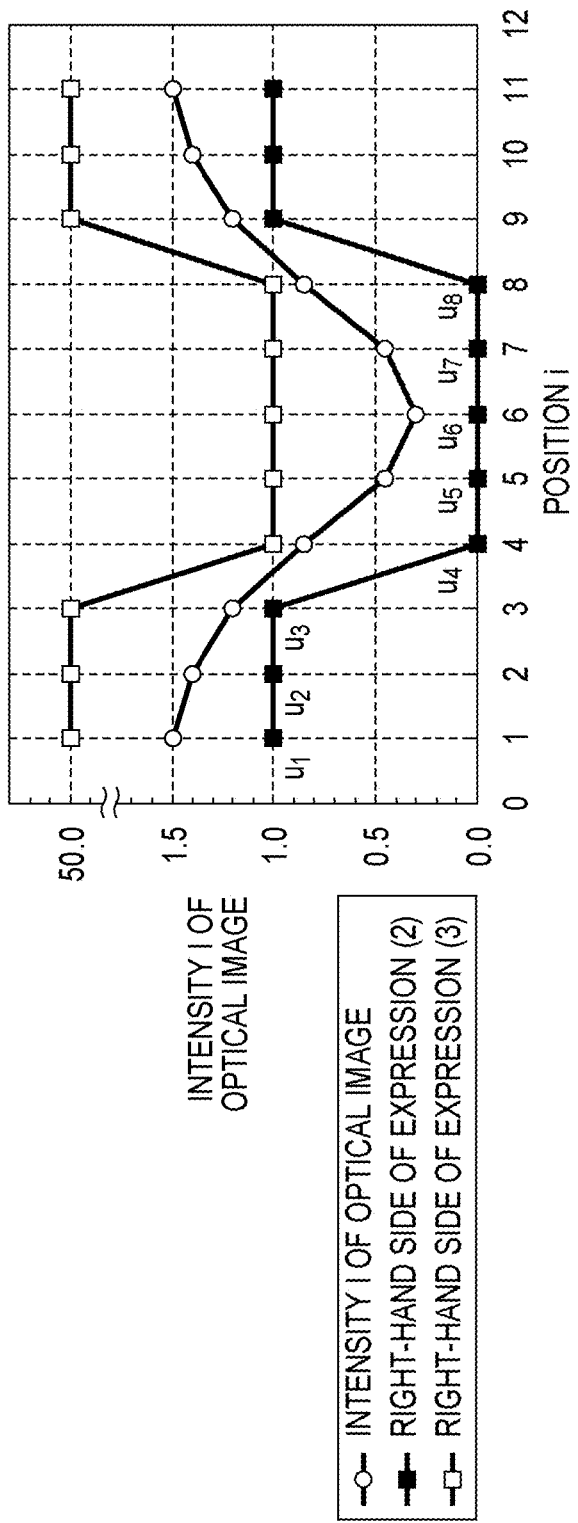
FIG. 8 is a graph for explaining the determination of an effective light source in step S114 of the flowchart shown in FIG. 1.

FIG. 8 is a graph schematically showing the relation presented in expression (14). As can be seen from FIG. 8, the range of intensities of the optical image is kept narrow by expressions (2) and (3). The intensity of the optical image has a value larger than 1 for a position at which the variable $u_{ij}$ takes "1", and it has a value smaller than 1 for a position at which the variable $u_{ij}$ takes "0". In this manner, information as to whether the resist can dissolve directly corresponds to the value of the variable $u_{ij}$.

Expression (4) is associated with the midpoint position of the optical image of the mask pattern, that is, describes the difference between the target position set in step S106 and the midpoint position of an actual optical image. The definition of constants in expression (4) will be described. $PS_j$ is the target position of the midpoint position of the optical image of the mask pattern on the j-th cutline. $A_j$ is the maximum value of i, which satisfies $x_i<PS_j$, and B is the minimum value of i, which satisfies $x_i>PS_j$. $x_i$ is the i-th position (coordinate) on the cutline and given by:

$$x_i = (i-1) \cdot \Delta x \, \forall j$$

Figure 9:
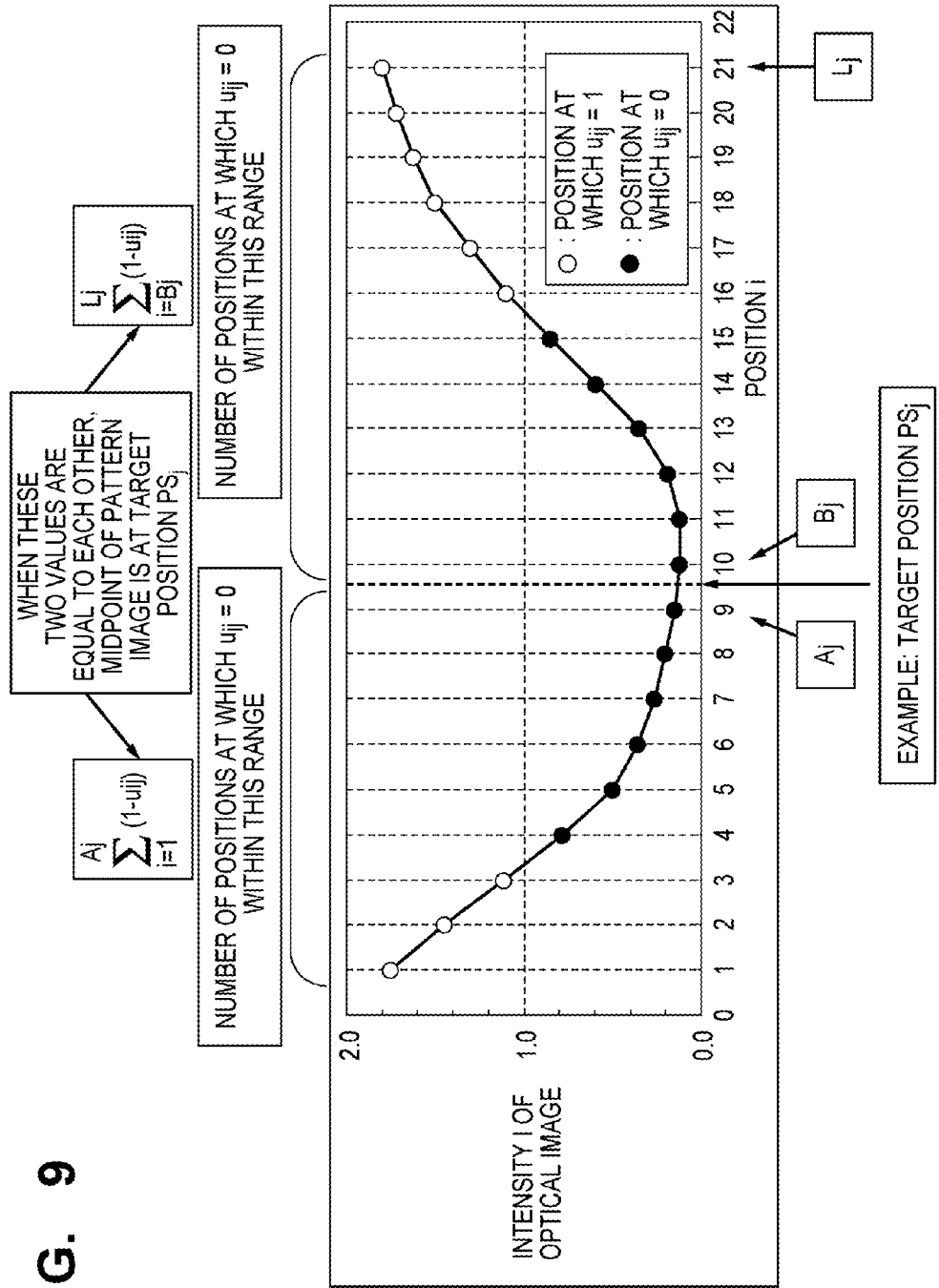
FIG. 9 is a graph for explaining the determination of an effective light source in step S114 of the flowchart shown in FIG. 1.

FIG. 9 is a graph showing the relationship between the i-th position on an arbitrary cutline, and the intensity value ($\Sigma I_{ijk}p_k$) of the optical image at this position. When the target position $PS_j$ for the midpoint position of the optical image of the mask pattern is set as shown in FIG. 9, $A_j=9$, $B_j=10$, and $L_j=21$.

The meaning of expression (4) will be explained. "$1-u_{ij}$" included in the left-hand side of expression (4) takes "1" if $u_{ij}=0$, and takes "0" if $u_{ij}=1$. Therefore, $\Sigma(1-u_{ij})$ represents "the number of grids when $u_{ij}=0$". In this embodiment, the resist used is a positive resist, so $\Sigma(1-u_{ij})$ is the length of a portion in which the intensity value falls below the slice level, that is, an amount proportional to the dimension of a portion in which the resist remains behind.

In this manner, the first term in the absolute value on the left-hand side of expression (4) represents "the number of grids when $u_{ij}=0$" on the left side of the target position of the midpoint position of the optical image of the mask pattern. Also, the second term in the absolute value on the left-hand side of expression (4) represents "the number of grids when $u_{ij}=0$" on the right side of the target value of the midpoint position of the optical image of the mask pattern. When these two values are equal to each other, the midpoint position of the optical image of the mask pattern coincides with its target position, so the absolute value is zero on the left-hand side of expression (4). Expression (4) limits the absolute value of the value obtained by expression (4). Therefore, minimization (see expression (1)) of the nonnegative variable t (see expression (9)) is a problem to be solved using mathematical programming.

Note that in this embodiment, the midpoint position of the optical image of the mask pattern is optimized, and the midpoint position of this optical image has a one-to-one correspondence with the amount of pattern shift. Therefore, in this embodiment, the effective light source is optimized in consideration of a pattern shift of the optical image of the mask pattern.

Expressions (5) and (12) are associated with the line width of the optical image of the mask pattern. In this embodiment, the length of a continuous dark portion in the optical image is equal to the line width of the optical image, so the line width Width at this time can be approximated by:

$$\text{Width} \approx \sum_{i=1}^{L_j} (1 - u_{ij}) \cdot \Delta x \quad (15)$$

On the other hand, using the integer $W_j$ presented in expression (12), the target width $\text{Width}_j$ of the line width of an optical image formed on the j-th cutline can be approximated by:

$$\text{Width}_j \approx W_j \cdot \Delta x \quad (16)$$

Note that the Int function included in expression (12) is a function which means that the fractional part of a given number is dropped, and Int(A+0.5) for the nonnegative real number A is equivalent to rounding of the nonnegative real number A. Therefore, from expressions (15) and (16), the difference between the target width of the line width of the optical image and the line width of the optical image in the optimization result is proportional to:

$$\sum_{i=1}^{L_j} (1 - u_{ij}) - W_j \quad (17)$$

As the solution of expression (17) comes closer to zero, the difference between the target width of the line width of the optical image and the line width of the optical image in the optimization result reduces. Expression (5) is a constraint which limits the absolute value of the solution presented in expression (17) to the variable t or less. Therefore, minimization (see expression (1)) of the nonnegative variable t (see expression (9)) is a problem to be solved using mathematical programming. Note that when a demand for the line width of the pattern is not so strict, and only a pattern shift is desired to be taken into consideration, the effective light source can also be optimized in consideration of only the midpoint position of the optical image without taking the line width of the optical image into consideration. In such a case, expressions (5) and (12) can be excluded from expression group 1.

Figure 10:
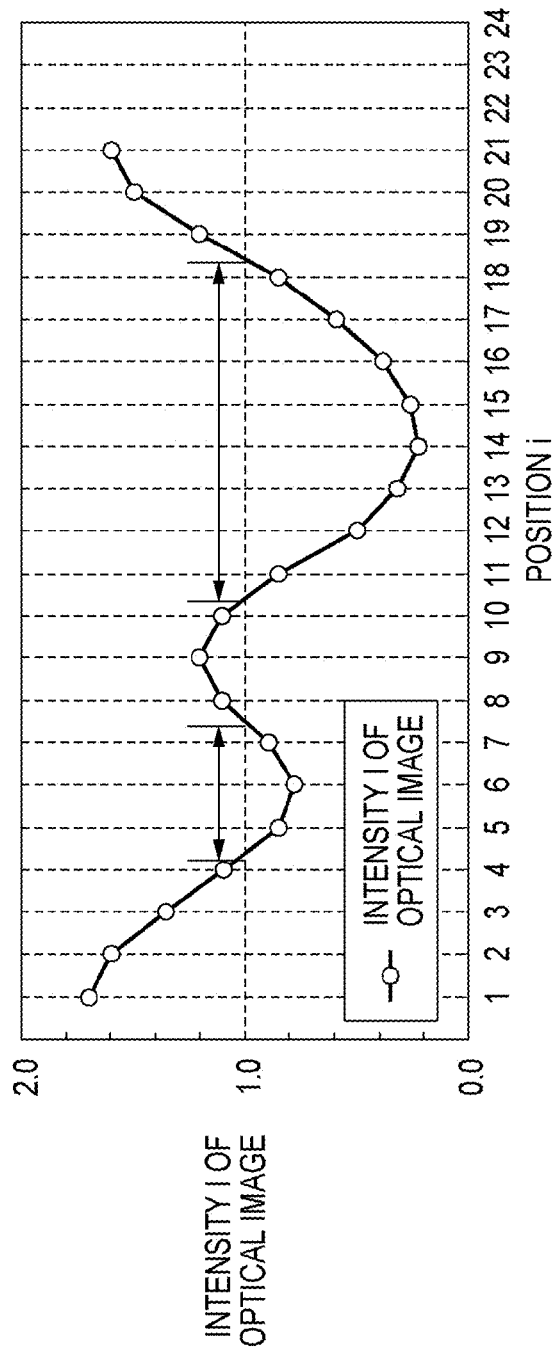
FIG. 10 is a graph for explaining the determination of an effective light source in step S114 of the flowchart shown in FIG. 1.
Figure 11:
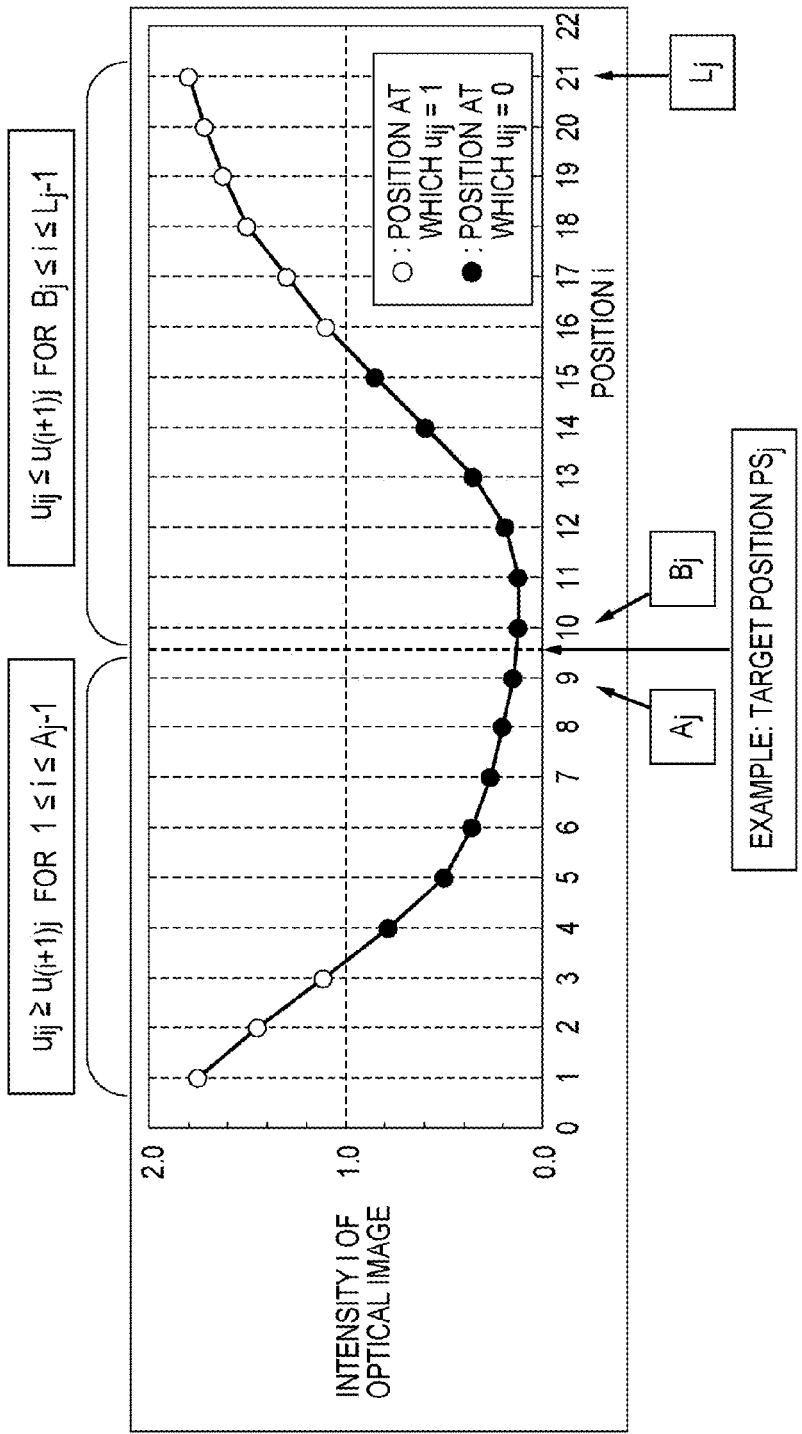
FIG. 11 is a graph for explaining the determination of an effective light source in step S114 of the flowchart shown in FIG. 1.

Expressions (6) and (7) serving as constraints will be described. To allow the midpoint position and line width of the optical image of the mask pattern to have a correct physical meaning, a portion in which the resist remains behind always needs to be continuous. When, for example, the intensity value of the intensity distribution of the optical image of the mask pattern falls below the slice level in two separated portions, as shown in FIG. 10, this optical image intensity distribution is undesirable. For this reason, in this embodiment, expressions (6) and (7), as shown in FIG. 11, are defined as constraints to prevent such an optical image intensity distribution from being derived as an optimization result. FIG. 11 is a graph schematically showing the meaning of expressions (6) and (7).

In this manner, an effective light source optimization problem which directly evaluates the midpoint position (and line width) of the optical image of the mask pattern can be replaced with a mixed integer programming problem which brings the sum of the binary variables $u_{ij}$ close to a target value.

Figure 12:
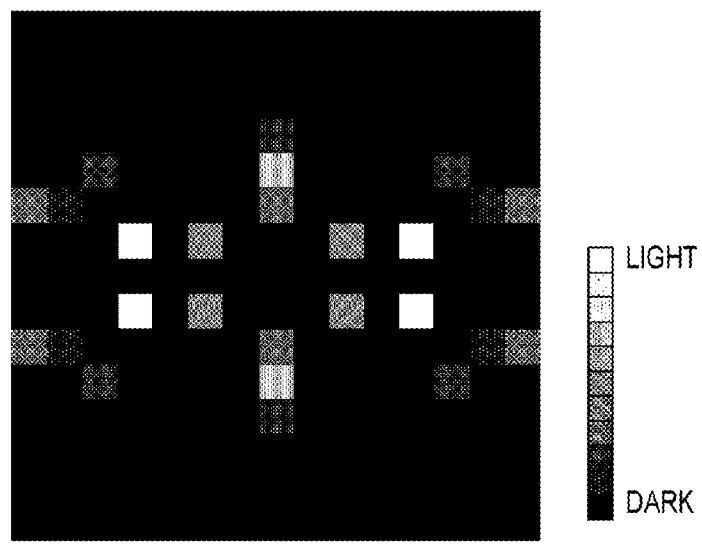
FIG. 12 is a view showing the effective light source determined in step S114 of the flowchart shown in FIG. 1.

In this embodiment, an optimization result (the light emission intensities $p_k$ of the 177 element light sources) shown in Table 2 was obtained for the target positions of the midpoint positions of the optical images of the mask pattern and the target widths of the line widths of the optical images of the mask pattern, both shown in Table 1. The plurality of element light sources generated in step S110 are weighted with the light emission intensities $p_k$ shown in Table 2, and are combined, thereby obtaining an effective light source, as shown in FIG. 12.

TABLE 2

| Element Light Source Number k | Light Emission Intensity $p_k$ |
|---|---|
| 1 | 0 |
| 2 | 0 |
| 3 | 0 |
| 4 | 0 |
| 5 | 0 |
| 6 | 0 |
| 7 | 0 |
| 8 | 0 |
| 9 | 0 |
| 10 | 0 |
| 11 | 0 |
| 12 | 0 |
| 13 | 0 |
| 14 | 0 |
| 15 | 0 |
| 16 | 0 |
| 17 | 0 |
| 18 | 0 |
| 19 | 0 |
| 20 | 0 |
| 21 | 0 |
| 22 | 0 |
| 23 | 0 |
| 24 | 0 |
| 25 | 0 |
| 26 | 0 |
| 27 | 0 |
| 28 | 0 |
| 29 | 0 |
| 30 | 0 |
| 31 | 0 |
| 32 | 0.0603994 |
| 33 | 0 |
| 34 | 0 |
| 35 | 0 |
| 36 | 0 |
| 37 | 0 |
| 38 | 0 |
| 39 | 0 |
| 40 | 0.0539869 |
| 41 | 0 |
| 42 | 0 |
| 43 | 0 |
| 44 | 0 |
| 45 | 0.1642760 |
| 46 | 0 |
| 47 | 0 |
| 48 | 0 |
| 49 | 0 |
| 50 | 0.0539869 |
| 51 | 0 |
| 52 | 0.0682349 |
| 53 | 0.0338880 |
| 54 | 0 |
| 55 | 0 |
| 56 | 0 |
| 57 | 0 |
| 58 | 0 |
| 59 | 0.0675053 |
| 60 | 0 |
| 61 | 0 |
| 62 | 0 |
| 63 | 0 |
| 64 | 0 |
| 65 | 0.0338880 |
| 66 | 0.0682349 |
| 67 | 0 |
| 68 | 0 |
| 69 | 0 |
| 70 | 0.2463640 |
| 71 | 0 |
| 72 | 0.1296630 |
| 73 | 0 |
| 74 | 0 |
| 75 | 0 |
| 76 | 0.1296630 |
| 77 | 0 |
| 78 | 0.2463640 |
| 79 | 0 |
| 80 | 0 |
| 81 | 0 |
| 82 | 0 |
| 83 | 0 |
| 84 | 0 |
| 85 | 0 |
| 86 | 0 |
| 87 | 0 |
| 88 | 0 |
| 89 | 0 |
| 90 | 0 |
| 91 | 0 |
| 92 | 0 |
| 93 | 0 |
| 94 | 0 |
| 95 | 0 |
| 96 | 0 |
| 97 | 0 |
| 98 | 0 |
| 99 | 0 |
| 100 | 0.2463640 |
| 101 | 0 |
| 102 | 0.1296630 |
| 103 | 0 |
| 104 | 0 |
| 105 | 0 |
| 106 | 0.1296630 |
| 107 | 0 |
| 108 | 0.2463640 |
| 109 | 0 |
| 110 | 0 |
| 111 | 0 |
| 112 | 0.0682349 |
| 113 | 0.0338880 |
| 114 | 0 |
| 115 | 0 |
| 116 | 0 |
| 117 | 0 |
| 118 | 0 |
| 119 | 0.0675053 |
| 120 | 0 |
| 121 | 0 |
| 122 | 0 |
| 123 | 0 |
| 124 | 0 |
| 125 | 0.0338880 |
| 126 | 0.0682349 |
| 127 | 0 |
| 128 | 0.0539869 |
| 129 | 0 |
| 130 | 0 |
| 131 | 0 |
| 132 | 0 |

TABLE 2-continued

| Element Light Source Number k | Light Emission Intensity $p_k$ |
|---|---|
| 133 | 0.1642760 |
| 134 | 0 |
| 135 | 0 |
| 136 | 0 |
| 137 | 0 |
| 138 | 0.0539869 |
| 139 | 0 |
| 140 | 0 |
| 141 | 0 |
| 142 | 0 |
| 143 | 0 |
| 144 | 0 |
| 145 | 0 |
| 146 | 0.0603994 |
| 147 | 0 |
| 148 | 0 |
| 149 | 0 |
| 150 | 0 |
| 151 | 0 |
| 152 | 0 |
| 153 | 0 |
| 154 | 0 |
| 155 | 0 |
| 156 | 0 |
| 157 | 0 |
| 158 | 0 |
| 159 | 0 |
| 160 | 0 |
| 161 | 0 |
| 162 | 0 |
| 163 | 0 |
| 164 | 0 |
| 165 | 0 |
| 166 | 0 |
| 167 | 0 |
| 168 | 0 |
| 169 | 0 |
| 170 | 0 |
| 171 | 0 |
| 172 | 0 |
| 173 | 0 |
| 174 | 0 |
| 175 | 0 |
| 176 | 0 |
| 177 | 0 |

Figure 13:
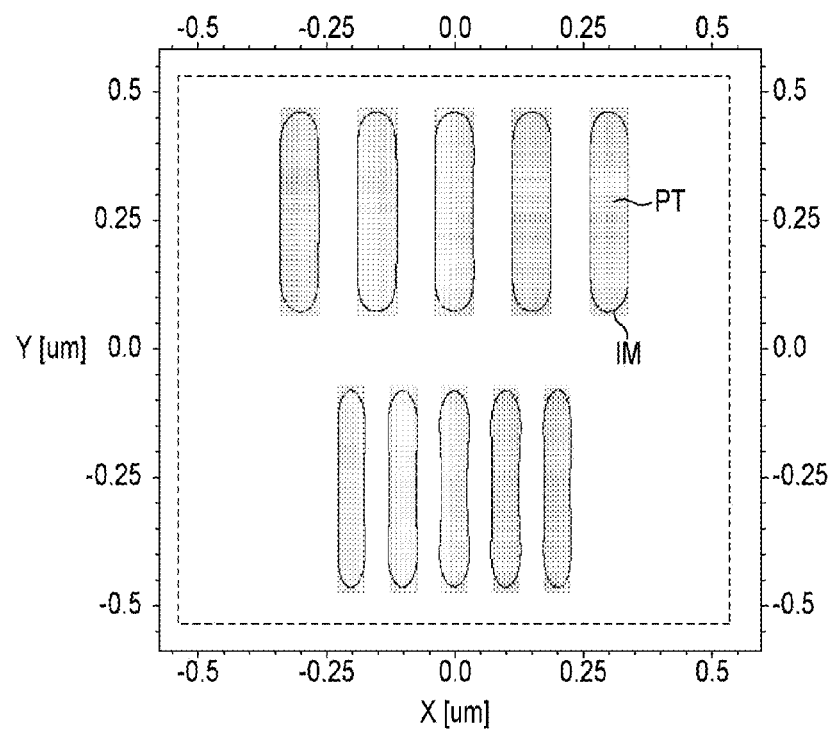
FIG. 13 is a view showing an optical image formed on the image plane of a projection optical system upon illuminating the mask pattern shown in FIG. 2 with the effective light source shown in FIG. 12.

FIG. 13 is a view showing an optical image formed on the image plane of the projection optical system upon illuminating the mask pattern shown in FIG. 2 with the effective light source shown in FIG. 12. In FIG. 13, reference symbol PT denotes a pattern group of the mask pattern; and IM, an optical image (the boundary line of a portion in which the resist remains behind). Table 3 shows the midpoint positions and line widths of optical images of the mask pattern, which are formed on the cutlines CL1 to CL6, respectively, at this time. As can be seen from FIG. 13 and Table 3, only little pattern shifts occur, and the midpoint positions and line widths of optical images of the mask pattern, which are formed on the cutlines CL1 to CL6, respectively, are close to their target positions and target widths, respectively.

TABLE 3

| | Cutline | | | | | |
|---|---|---|---|---|---|---|
| | CL1 | CL2 | CL3 | CL4 | CL5 | CL6 |
| Midpoint Position [nm] | 60 | 59.99 | 60.33 | 45 | 45 | 44.97 |
| Line Width [nm] | 74.67 | 75.1 | 75.2 | 49.73 | 50.71 | 49.67 |

The fact that effective light source optimization in this embodiment is mathematically accurate will be described herein. A target position for the midpoint position of the optical image of the mask pattern and a target width for the line width of the optical image of the mask pattern are set for each of the cutlines CL1 to CL3, as shown in Table 4. A target position for the midpoint position of the optical image of the mask pattern and a target width for the line width of the optical image of the mask pattern, both shown in Table 4, are greatly changed from the design values of the mask pattern, and their achievement therefore requires difficult optimization. Note that the cutlines CL4 to CL6 are not taken into consideration.

TABLE 4

| | Cutline | | |
|---|---|---|---|
| | CL1 | CL2 | CL3 |
| Target Position [nm] | 60 | 60 | 70 |
| Target Width [nm] | 75 | 65 | 75 |

Figure 14:
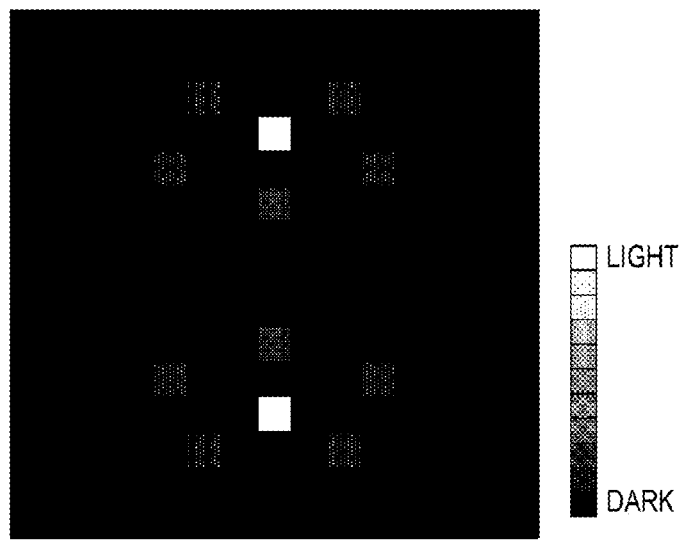
FIG. 14 is a view showing the effective light source determined in step S114 of the flowchart shown in FIG. 1.
Figure 15:
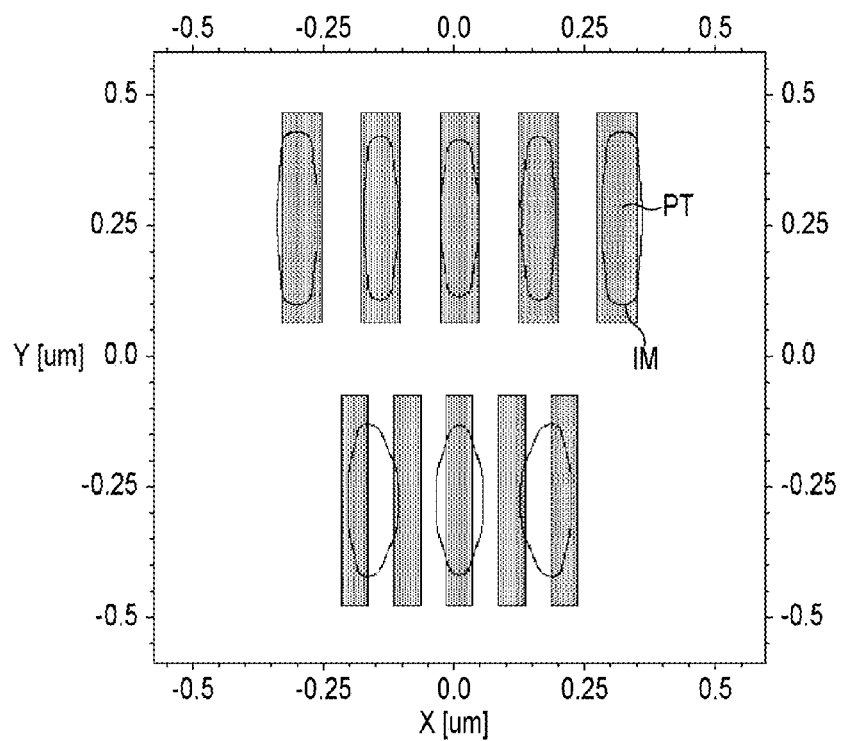
FIG. 15 is a view showing an optical image formed on the image plane of a projection optical system upon illuminating the mask pattern shown in FIG. 2 with the effective light source shown in FIG. 14.

In this embodiment, an effective light source, as shown in FIG. 14, is obtained for the target position of the midpoint position of the optical image of the mask pattern and the target width of the line width of the optical image of the mask pattern, both shown in Table 4. FIG. 15 is a view showing an optical image formed on the image plane of the projection optical system upon illuminating the mask pattern shown in FIG. 2 with the effective light source shown in FIG. 14. In FIG. 15, reference symbol PT denotes a pattern group of the mask pattern; and IM, an optical image (the boundary line of a portion in which the resist remains behind). Table 5 shows the midpoint positions and line widths of optical images of the mask pattern, which are formed on the cutlines CL1 to CL3, respectively, at this time. As can be seen from FIG. 15 and Table 5, effective light source optimization in this embodiment is applicable even to difficult optimization, and is therefore mathematically accurate.

TABLE 5

| | Cutline | | |
|---|---|---|---|
| | CL1 | CL2 | CL3 |
| Midpoint Position [nm] | 60 | 60 | 70.03 |
| Line Width [nm] | 74.64 | 65.3 | 75.69 |

Note that this embodiment takes the symmetry of the effective light source into consideration. The symmetry of the effective light source can be estimated from that of the mask pattern, and is set such that an effective light source obtained as a final solution exhibits four-fold symmetry (vertical/horizontal symmetry). More specifically, $$p_1 = p_5 = p_{173} = p_{177} \tag{18}$$

$$p_{39} = p_{51} = p_{127} = p_{139} \tag{19}$$

$$p_{85} = p_{93} \tag{20}$$

need only be added to expression group 1 as new constraints.

Expressions (18) to (20) are some of relations which constrain the symmetry of the effective light source in this embodiment, and similar relations are set for all the light emission intensities $p_k$ (k=1 to 177). In this manner, taking the symmetry between the element light sources into consideration makes it possible to practically decrease the number of independent variables, thus shortening the computation time. Note that the relations between the element light sources are not limited to these specific ones, and other relations may be set.

Second Embodiment

In the first embodiment, all cutlines are assumed as cutlines of interest to be used to form optical images (portions in which the resist remains behind) of line patterns. However, in practice, attention is often focused on optical images (portions in which the resist dissolves) of space patterns. In the latter case, some expressions included in expression group 1 need only be replaced in the following way.

When attention is focused on space patterns, the definition of the value of the variable $u_{ij}$ in expression (14) need only be reversed, so expressions (2) and (3) included in expression group 1 need only be respectively replaced with:

$$\sum_{k=1}^{m} I_{ijk} p_k > 1 - u_{ij} \ \forall i, \forall j \quad (21)$$

$$\sum_{k=1}^{m} I_{ijk} p_k < u_{ij} + M \cdot (1 - u_{ij}) \ \forall i, \forall j \quad (22)$$

According to expressions (21) and (22), the variable $u_{ij}$ has a meaning as presented in:

$$u_{ij} = \begin{cases} 0 & \text{if } \left(\sum_{k=1}^{m} I_{ijk} p_k > 1\right) \\ 1 & \text{if } \left(\sum_{k=1}^{m} I_{ijk} p_k < 1\right) \end{cases} \quad (23)$$

Therefore, the effective light source can be optimized in consideration of the midpoint positions (and line widths) of the optical images of space patterns (light portions), as in the first embodiment.

The effective light source can be optimized even if a cutline used to evaluate the line width of a light portion in an optical image, and a cutline used to evaluate the line width of a dark portion in the optical image mix with each other. In this case, expressions (21) and (22) need only be provided as the definition of the variable $u_{ij}$ for a cutline used to evaluate the line width of a light portion in an optical image, and expressions (2) and (3) need only be provided as the definition of the variable $u_{ij}$ for a cutline used to evaluate the line width of a dark portion in the optical image.

Third Embodiment

In expression group 1 presented in the first embodiment, expressions (4) and (5) are limited by the same variable t for all numbers j. In other words, the variable t is the maximum value of each of the left-hand side of expression (4) and the left-hand side of expression (5), and expression group 1 serves as a problem for minimizing the variable t, thus presenting a problem for "maximum value minimization".

In this embodiment, a mixed integer programming problem is solved upon replacing expression (1) serving as an objective function in expression group 1 with:

$$\text{Minimization: } \sum (\alpha_j \cdot t1_j + \beta_j \cdot t2_j) \quad (24)$$

$$\left| \sum_{i=1}^{A_j} (1 - u_{ij}) - \sum_{i=B_j}^{L_j} (1 - u_{ij}) \right| \leq t1_j \ \forall j \quad (25)$$

$$\left| \sum_{i=1}^{L_j} (1 - u_{ij}) - W_j \right| \leq t2_j \ \forall j \quad (26)$$

$$t1_j \geq 0 \ \forall j \quad (27)$$

$$t2_j \geq 0 \ \forall j \quad (28)$$

This problem has a variable $t1_j$ defined for each number j with regard to pattern shift optimization and a variable $t2_j$ defined for each number j with regard to line width optimization, and minimizes the linear sum of the variables $t1_j$ and $t2_j$.

$\alpha_j$ and $\beta_j$ in expression (24) are numerical values of 0 or more given by the user in advance. For example, 1 is substituted for $\alpha_1$, $\beta_2$, $\alpha_3$, $\alpha_4$, and $\alpha_5$, 5 is substituted for $\alpha_6$, and 1 is substituted for $\beta_1$, $\beta_2$, $\beta_3$, $\beta_4$, $\beta_5$, and $\beta_6$. In this case, expression (24) is $t1_1+t1_2+t1_3+t1_4+t1_5+5\times t1_6+t2_1+t2_2+t2_3+t2_4+t2_5+t2_6$. Thus, the value of the variable $t1_6$ has a greatest influence on $\Sigma(\alpha_j t_j+\beta_j t_j)$, so a solution in which the value of the variable $t1_6$ is smallest can be obtained. In this manner, arbitrarily setting the numerical values $\alpha_j$ and $\beta_j$ makes it possible to obtain an effective light source in which a pattern closer to a critical pattern has a midpoint position (and dimension) of the optical image, that has a smaller difference from its target position (and target width).

Fourth Embodiment

In the actual fabrication of a semiconductor device, the amount of defocus at the time of exposure must also be taken into consideration. In general, an effective light source which changes neither pattern shifts nor the line widths of optical images of the mask pattern even if defocus from the image plane of the projection optical system occurs is preferable.

Although the effective light source is optimized for one focus plane in the first to third embodiments, it can also be optimized for a plurality of defocus planes defocused from the image plane of the projection optical system.

More specifically, a plurality of defocus planes are set, and optical images of the mask pattern, which are formed at positions corresponding to the cutlines, are calculated for each of the plurality of defocus planes in step S112. Setting target positions for the midpoint positions (and target widths for the line widths) of these optical images, respectively, makes it possible to optimize the effective light source while taking defocus into consideration.

Cutlines (their corresponding positions) which have the same characteristics but are set on the plurality of different defocus planes, respectively, can be regarded as different cutlines. In this embodiment, cutlines obtained by defocusing cutlines CL1 to CL6 by +25 nm are regarded as cutlines CL7 to CL12, respectively. Again in this embodiment, cutlines obtained by defocusing the cutlines CL1 to CL6 by +50 nm are regarded as cutlines CL13 to CL18, respectively.

FIG. 16 shows an effective light source obtained upon setting target positions and target widths, as shown in Table 6, for optical images formed on the cutlines CL1 to CL18, respectively. Table 7 shows the midpoint positions and line widths of optical images of the mask pattern, which are formed on the cutlines CL1 to CL18, respectively, at this time.

TABLE 6

|  | | Cutline | | | | | |
| --- | --- | --- | --- | --- | --- | --- | --- |
|  | Defocus | CL1 | CL2 | CL3 | CL4 | CL5 | CL6 |
| Target Position [nm] | 0 nm | 60 | 60 | 60 | 45 | 45 | 45 |
|  | 25 nm | 60 | 60 | 60 | 45 | 45 | 45 |
|  | 50 nm | 60 | 60 | 60 | 45 | 45 | 45 |
| Target Width [nm] | 0 nm | 75 | 75 | 75 | 50 | 50 | 50 |
|  | 25 nm | 75 | 75 | 75 | 50 | 50 | 50 |
|  | 50 nm | 75 | 75 | 75 | 50 | 50 | 50 |

TABLE 7

|  | | Cut Line | | | | | |
| --- | --- | --- | --- | --- | --- | --- | --- |
|  | Defocus | CL1 | CL2 | CL3 | CL4 | CL5 | CL6 |
| Midpoint Position [nm] | 0 nm | 60 | 59.66 | 59.67 | 45 | 44.9 | 44.68 |
|  | 25 nm | 60 | 59.67 | 59.39 | 45 | 44.62 | 44.76 |
|  | 50 nm | 60 | 59.74 | 58.45 | 45 | 43.62 | 45 |
| Line Width [nm] | 0 nm | 75.92 | 74.27 | 77.14 | 48.88 | 51.16 | 51.4 |
|  | 25 nm | 75.52 | 74.49 | 76.14 | 48.88 | 51.36 | 50.47 |
|  | 50 nm | 74.14 | 75.24 | 72.8 | 48.93 | 52.02 | 46.8 |

According to this embodiment, the effective light source can be optimized in consideration of defocus. In this embodiment, only optical images obtained upon defocus in the positive direction are taken into consideration. However, optical images obtained upon defocus in the negative direction may be taken into consideration, or both optical images obtained upon defocus in the positive direction and those obtained upon defocus in the negative direction may be taken into consideration.

Fifth Embodiment

In the actual fabrication of a semiconductor device, the amount of exposure (dose) at the time of exposure must also be taken into consideration. In general, an effective light source which changes neither pattern shifts nor the line widths of optical images of the mask pattern even if a dose different from an ideal dose is used is preferable.

The dose means the total amount of exposure. Therefore, in the first to fourth embodiments, when a light emission intensity $p_k$ (k=1 to 177) is obtained as a solution, the dose is $\Sigma p_k$. This dose is defined as a reference dose. For example, an increase in dose by a factor of 1.1 is equivalent to an increase in value of all the light emission intensities $p_k$ by a factor of 1.1.

The effective light source can be optimized for a plurality of doses in the same way as in the fourth embodiment. In the fifth embodiment, three doses: a reference dose, a 1.1-times dose, and a 0.9-times dose are set (that is, the values of the light emission intensities $p_k$ are proportionally multiplied by given factors to generate proportional-multiplication element light sources). Target positions for the midpoint positions (and target widths for the line widths) of optical images formed on cutlines CL1 to CL6, respectively, are set for each dose. In this case, the cutlines CL1 to CL6 corresponding to a 1.1-times dose are regarded as cutlines CL7 to CL12, respectively, and those corresponding to a 0.9-times dose are regarded as cutlines CL13 to CL18, respectively. Expressions (2) and (3) included in expression group 1 need only be replaced with:

$$\sum_{k=1}^{m} I_{ijk} p_k > u_{ij} \ \forall \ i, j \in \{j \mid 1 \le j \le 6\} \quad (29)$$

$$\sum_{k=1}^{m} I_{ijk} p_k < (1 - u_{ij}) + M u_{ij} \ \forall \ i, j \in \{j \mid 1 \le j \le 6\} \quad (30)$$

$$1.1 \cdot \sum_{k=1}^{m} I_{ijk} p_k > u_{ij} \ \forall \ i, j \in \{j \mid 7 \le j \le 12\} \quad (31)$$

$$1.1 \cdot \sum_{k=1}^{m} I_{ijk} p_k < (1 - u_{ij}) + M u_{ij} \ \forall \ i, j \in \{j \mid 7 \le j \le 12\} \quad (32)$$

$$0.9 \cdot \sum_{k=1}^{m} I_{ijk} p_k > u_{ij} \ \forall \ i, j \in \{j \mid 13 \le j \le 18\} \quad (33)$$

$$0.9 \cdot \sum_{k=1}^{m} I_{ijk} p_k < (1 - u_{ij}) + M u_{ij} \ \forall \ i, j \in \{j \mid 13 \le j \le 18\} \quad (34)$$

$$I_{ijk} = I_{i(j+6)k} = I_{i(j+12)k} \ \forall \ i, \forall \ k, j \in \{j \mid 1 \le j \le 6\} \quad (35)$$

Expression (35) describing that the optical image formed on the same cutline remains the same even when the dose changes is further added to the features of the fourth embodiment.

Note that the dose value is not limited to a 1.1-times dose and a 0.9-times dose, and a 1.2-times dose and a 0.8-times dose, for example, may be used. The number of doses is not limited to three, either, and four or five doses may be used.

Sixth Embodiment

As described above, the calculation accuracy of an optical image (its intensity distribution) of the mask pattern can be improved by reducing $\Delta x$. However, a reduction in $\Delta x$ increases the number of constraints used to determine an effective light source, so the computation time may prolong. For this reason, an effective light source determination method which can improve the calculation accuracy of an optical image of the mask pattern while preventing prolongation of the computation time will be described in this embodiment.

Figure 17:
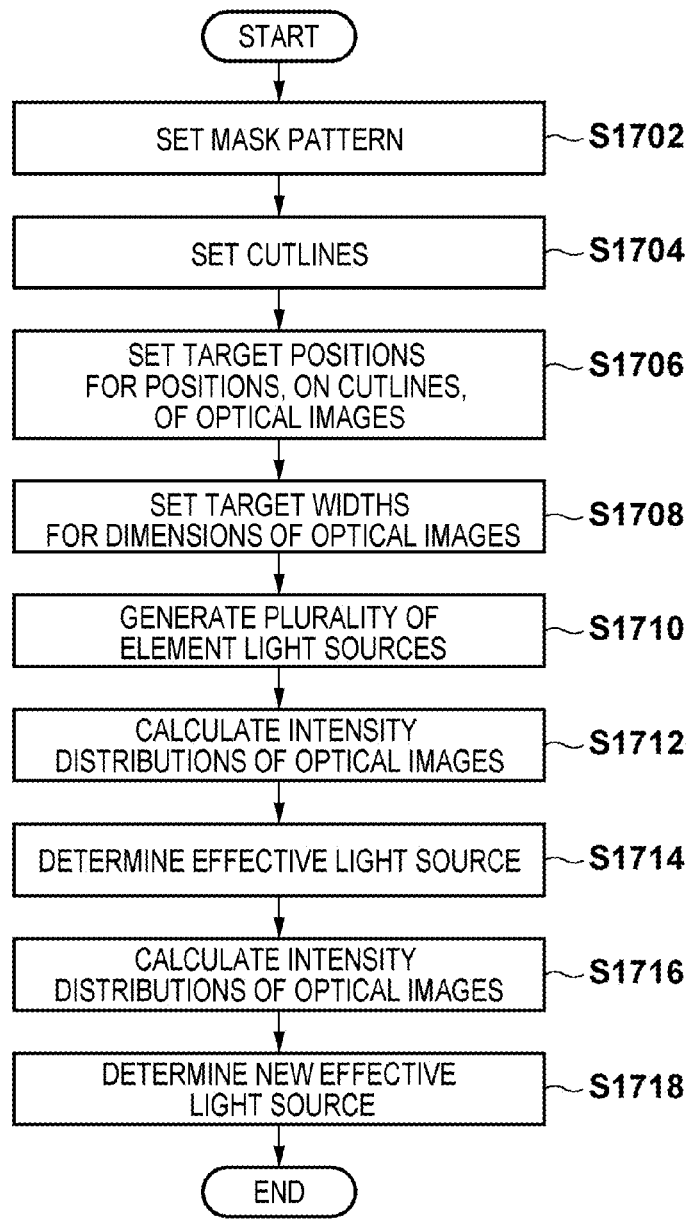
FIG. 17 is a flowchart for explaining a determination method according to another aspect of the present invention.

FIG. 17 is a flowchart for explaining a determination method according to another aspect of the present invention. This determination method includes steps S1716 (sixth step) and S1718 (seventh step), in addition to steps S1702 to S1714 that are the same as steps S102 to S114, respectively. In the determination method of this embodiment, calculation of an optical image of the mask pattern, which is formed on each cutline, is iterated using the effective light source determined in step S1714. More specifically, first, edge regions including the edges of an optical image of the mask pattern, which is formed on each cutline upon illuminating the mask pattern with the effective light source determined in step S1714, are specified in step S1716. An optical image of the mask pattern, which is formed on each cutline, is then calculated for each of the plurality of element light sources generated in step S1710. This is done such that the number (second number) of intensity data included in the edge region is larger than that (first number) of intensity data included in the edge region of the optical image of the mask pattern calculated in step S1712. In other words, the position (coordinate) on each cutline is re-divided so that an intensity is calculated for each of the second number of positions larger than the first number of positions included in the edge region of the optical image calculated in step S1712, thereby calculating an optical image of the mask pattern. Also, in step S1718, a new effective light source is determined based on the optical images calculated in step S1716. More specifically, a weight to be applied to each of the plurality of element light sources is determined such that the midpoint positions between the edges, on the cutlines, of optical images of the mask pattern come close to their target positions, thereby determining, as a new effective light source, a light source obtained by combining the plurality of element light sources applied with the weights.

In this manner, in this embodiment, calculation of an optical image (its intensity distribution) of the mask pattern, which is formed on each cutline, and determination of an effective light source are iterated (a plurality of times), thereby narrowing the ranges of positions of the edges of the optical image. This makes it possible to improve the calculation accuracy of an optical image of the mask pattern while preventing prolongation of the computation time.

Figure 18:
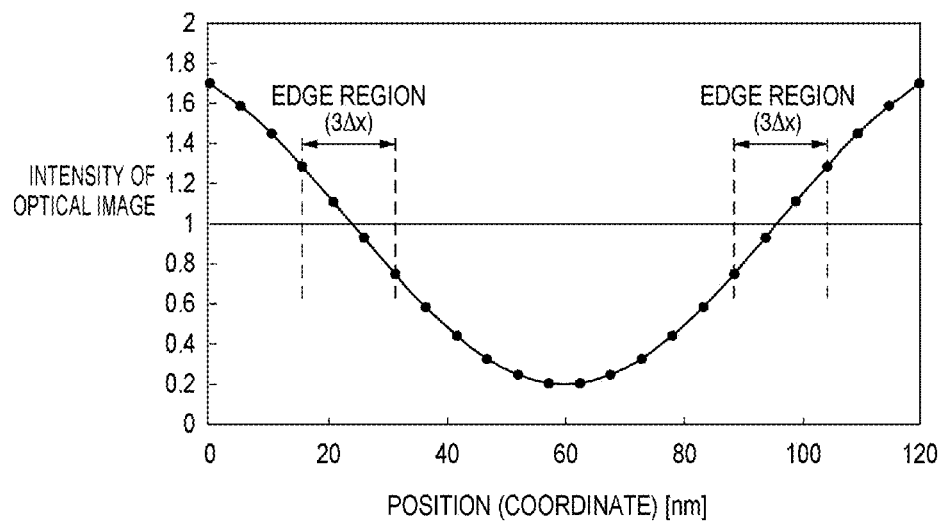
FIG. 18 is a graph showing the intensity distribution of an optical image of a mask pattern for an effective light source determined in step S1714 of the flowchart shown in FIG. 17.

An overview of repetition of calculation of an optical image (its intensity distribution), which is formed on each cutline, and determination of an effective light source, will be described herein. Assume, for example, that an intensity distribution, as shown in FIG. 18, is obtained as the intensity distribution of the optical image of the mask pattern for the effective light source determined in step S1714. At this time, attention is focused on a portion in which the intensity distribution of the optical image of the mask pattern crosses the slice level, that is, an interval Δx between adjacent positions having different values for the variable $u_{ij}$. Intensity distribution values (light intensities) are interpolated for an interval (edge region) which includes the interval Δx and has a specific width. Intervals for which intensity distribution values are interpolated exist on the right and left sides of the cutline, as shown in FIG. 18. In this embodiment, the position (coordinate) on the cutline is re-divided for each interval 3Δx. Although an interval for which intensity distribution values are interpolated may have a width of any multiple of the interval Δx, it desirably has a width three or more times that of the interval Δx in order to improve the computation accuracy.

Figure 19:
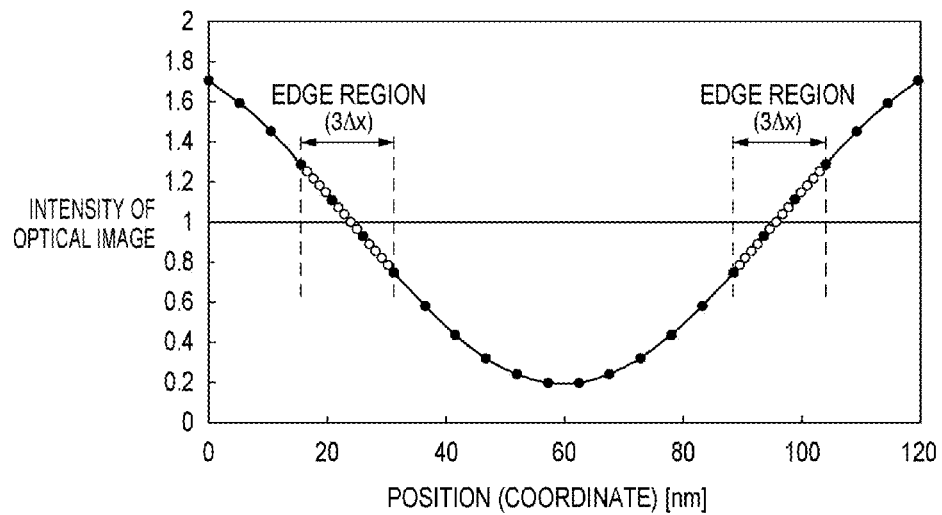
FIG. 19 is a graph showing the intensity distribution of the optical image of the mask pattern, which is calculated in step S1716 of the flowchart shown in FIG. 17.

FIG. 19 shows the result (that is, the intensity distribution of the optical image calculated in step S1716) of interpolating intensity distribution values (light intensities) for the interval 3Δk in the intensity distribution of the optical image of the mask pattern shown in FIG. 18. In FIG. 19, open circles indicate the interpolated intensity distribution values. In this manner, calculation of an optical image upon interpolating intensity distribution values which are not calculated in step S1712 is done for all of the plurality of element light sources.

Although the interval Δx is re-divided into five intervals in this embodiment, the interval Δx may be divided into any number of intervals. The interval Δx is preferably re-divided into four to eight intervals in consideration of the effect of improving both the computation time and the calculation accuracy. Also, although linear interpolation is used as an interpolation method in this embodiment, another interpolation method may be used or an optical image may be recalculated.

Figure 20:
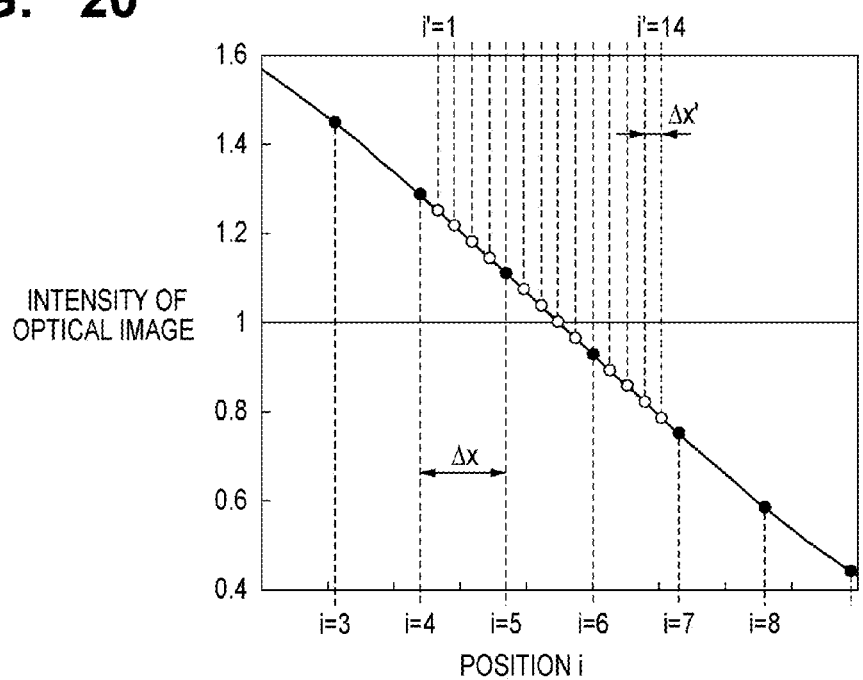
FIG. 20 is an enlarged graph showing the left interval (edge region) for which intensity distribution values are interpolated in the intensity distribution of the optical image of the mask pattern shown in FIG. 19.
Figure 21:
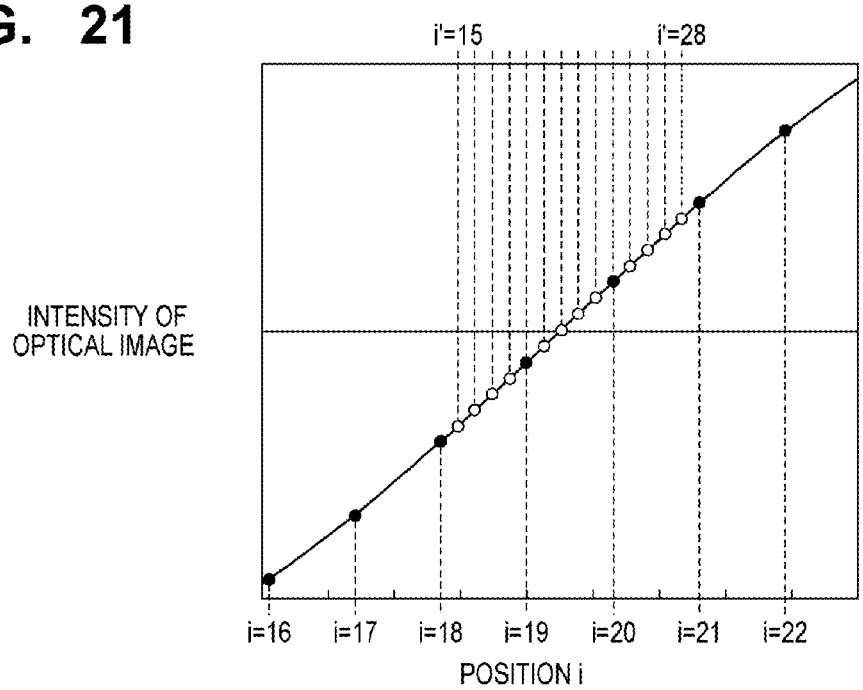
FIG. 21 is an enlarged graph showing the right interval (edge region) for which intensity distribution values are interpolated in the intensity distribution of the optical image of the mask pattern shown in FIG. 19.

FIGS. 20 and 21 are enlarged graphs showing the left and right intervals (edge regions), respectively, for which intensity distribution values are interpolated in the intensity distribution of the optical image of the mask pattern shown in FIG. 19. In FIGS. 20 and 21, let i' be the position (coordinate) obtained upon re-dividing the position i, and Δx' be the interval between the re-divided positions (coordinates). Referring to FIG. 20, the position i is re-divided for the interval from i=4 to i=7, including an interval Δx between adjacent positions having different values for the variable $u_{ij}$, that is, the interval between i=5 and 6. The re-divided position ranges from i'=1 to i'=14. Similarly, referring to FIG. 21, the position i is re-divided for the interval from i=18 to i=21, including an interval Δx between adjacent positions having different values for the variable $u_{ij}$, that is, the interval between i=19 and 20. The re-divided position ranges from i'=15 to i'=28.

Variables are defined for the positions i and i', respectively, and replacement with a mixed integer programming problem is performed, as in the first embodiment. However, positions i (i=5, 6, 19, and 20 in this embodiment) representing the same positions (coordinates) as specific positions i' are not included in the expressions.

Note that the previously obtained value of the variable $u_{ij}$ is set as a constant in repetition. In FIGS. 20 and 21, a variable $u_{ij}=1$ is set as a constant for i=4 or less or i=21 or more, and a variable $u_{ij}=0$ is set as a constant for i=7 to 18. This makes it possible to precisely recalculate only the interval between positions neighboring that (coordinate) which serves as a threshold for determination as to whether the resist dissolves.

An expression corresponding to expression (4) in expression group 1 can be derived from the target position $PS_j$, the intervals Δx and Δx', and the midpoint (the midpoint between positions i=7 and 18 in FIGS. 20 and 21) between the two edges of a position at which the intensity distribution value (light intensity) of the optical image is fixed to fall within the slice level. Also, expressions corresponding to expressions (5) and (12) in expression group 1 can be derived from the target width $Width_j$, the intervals Δx and Δx', and the interval in which the intensity distribution value (light intensity) of the optical image is fixed to fall within the slice level (i=7 to 18 in FIGS. 20 and 21).

Although calculation of an optical image (its intensity distribution) of the mask pattern, which is formed on each cutline, and determination of an effective light source are iterated only once in this embodiment, they may be iterated any number of times.

Figure 22:
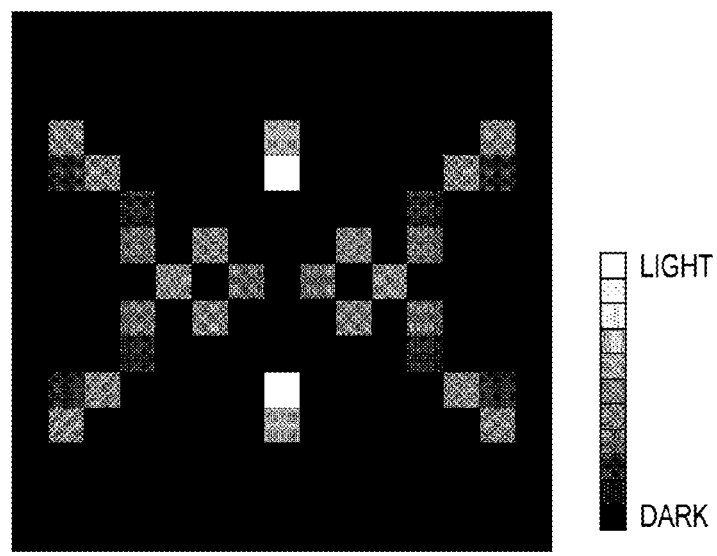
FIG. 22 is a view showing a new effective light source determined in step S1718 of the flowchart shown in FIG. 17.
Figure 23:
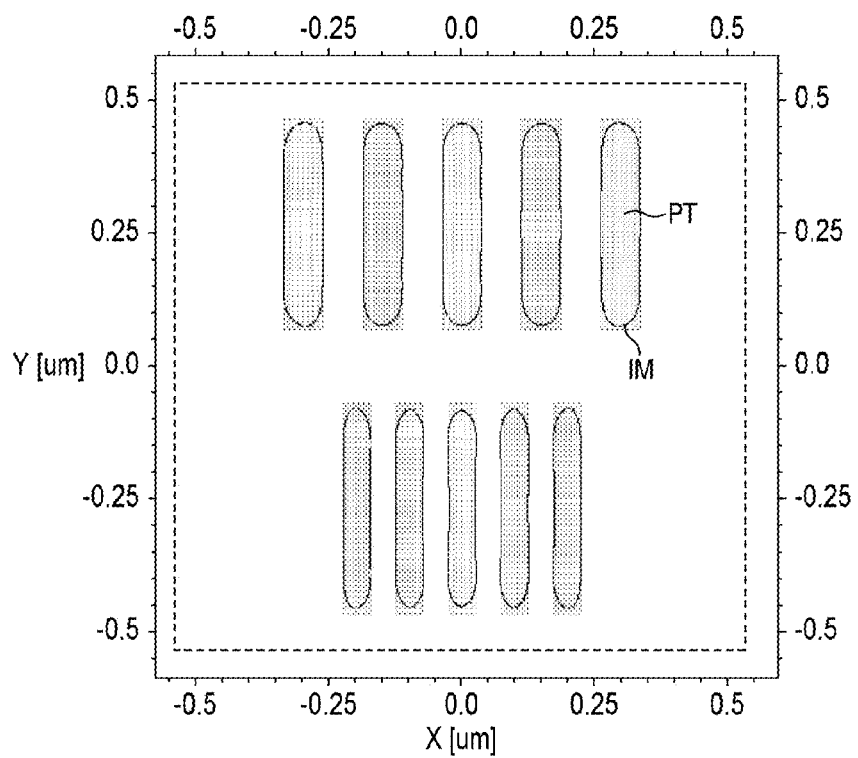
FIG. 23 is a view showing an optical image formed on the image plane of the projection optical system upon illuminating the mask pattern shown in FIG. 2 with the effective light source shown in FIG. 22.

FIG. 22 is a view showing the new effective light source determined in step S1718. FIG. 23 is a view showing an optical image formed on the image plane of the projection optical system upon illuminating the mask pattern shown in FIG. 2 with the effective light source shown in FIG. 22. In FIG. 23, reference symbol PT denotes a pattern group of the mask pattern; and IM, an optical image (the boundary line of a portion in which the resist remains behind). Table 8 shows the midpoint positions and line widths of optical images of the mask pattern, which are formed on cutlines CL1 to CL6, respectively, at this time. As can be seen from a comparison between Tables 3 and 8, when calculation of an optical image of the mask pattern, and determination of an effective light source, is iterated, the midpoint positions and line widths of optical images of the mask pattern, which are formed on the cutlines CL1 to CL6, respectively, further come close to their target positions and target widths, respectively.

TABLE 8

|  | Cutline | | | | | |
| --- | --- | --- | --- | --- | --- | --- |
|  | CL1 | CL2 | CL3 | CL4 | CL5 | CL6 |
| Midpoint Position [nm] | 60 | 59.97 | 59.9 | 45 | 45.01 | 44.98 |
| Line Width [nm] | 75.01 | 75.02 | 75.01 | 50.14 | 50.1 | 50.05 |

In this manner, the determination methods in the first to sixth embodiments can optimize (determine) the effective light source such that the amount of pattern shift falls within a tolerance (that is, the position of the optical image comes close to its target position).

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

Seventh Embodiment

Figure 24:
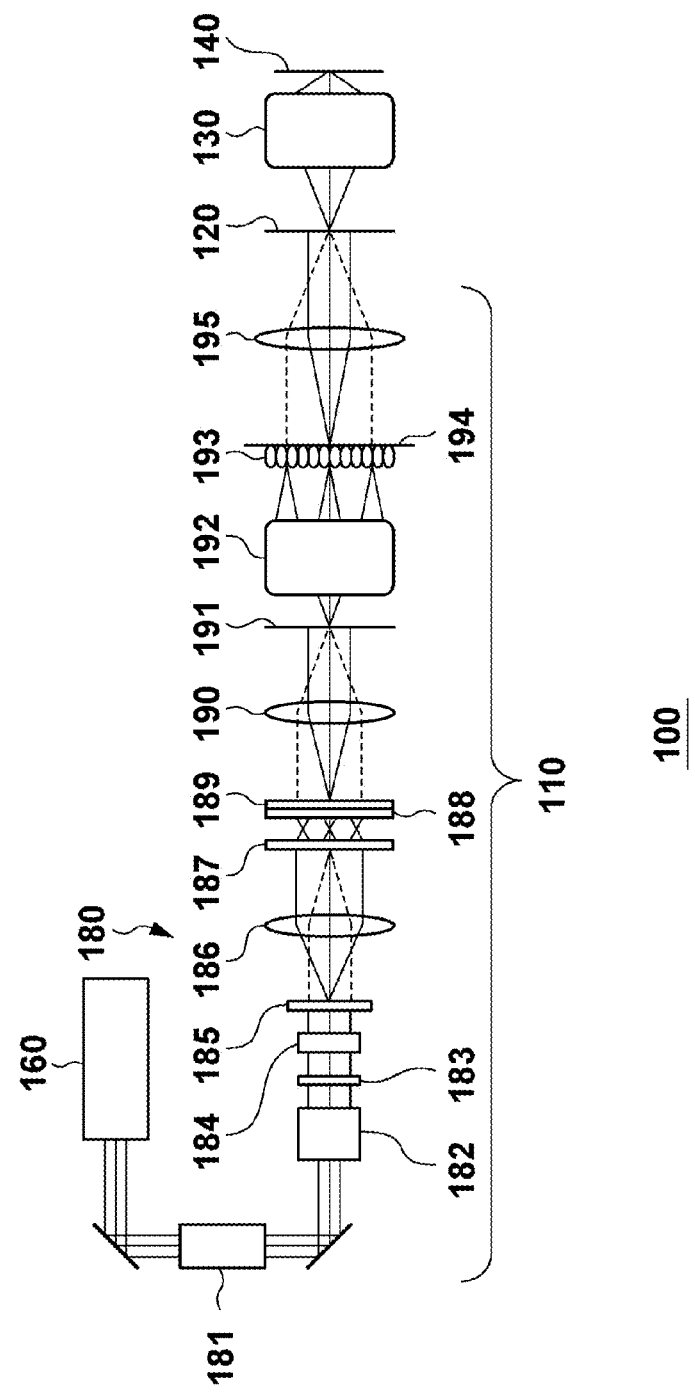
FIG. 24 is a schematic block diagram showing the arrangement of an exposure apparatus.

An exposure apparatus 100 which transfers the pattern of a mask illuminated with light from an illumination optical system onto a wafer will be described below with reference to FIG. 24. FIG. 24 is a schematic block diagram showing the arrangement of the exposure apparatus 100. The exposure apparatus 100 uses an illumination optical system 180 to form an effective light source determined by the above-mentioned determination method to illuminate the mask with the effective light source. Although the exposure apparatus 100 is of the step-and-scan type in this embodiment, it can also adopt the step-and-repeat type or another exposure type.

The exposure apparatus 100 includes an illumination device 110, a mask stage (not shown) which supports a mask 120, a projection optical system 130, and a wafer stage (not shown) which supports a wafer 140.

The illumination device 110 includes a light source 160 and the illumination optical system 180, and illuminates the mask 120 on which a circuit pattern to be transferred is formed. An excimer laser such as an ArF excimer laser having a wavelength of about 193 nm or a KrF excimer laser having a wavelength of about 248 nm, for example, is used as the light source 160. However, the types and number of light sources 160 are not particularly limited, and an $F_2$ laser having a wavelength of about 157 nm or a narrowband mercury lamp, for example, can also be used as the light source 160. The illumination optical system 180 illuminates the mask 120 with light from the light source 160, and forms an effective light source determined by the above-mentioned determination method. The illumination optical system 180 includes a routing optical system 181, beam shaping optical system 182, polarization control unit 183, phase control unit 184, exit angle control optical element 185, relay optical system 186, and multibeam generation unit 187. The illumination optical system 180 also includes a polarization state adjusting unit 188, computer generated hologram 189, relay optical system 190, aperture 191, zoom optical system 192, multibeam generation unit 193, aperture stop 194, and irradiation unit 195.

The routing optical system 181 deflects the light from the light source 160 to guide it to the beam shaping optical system 182. The beam shaping optical system 182 converts the aspect ratio of the cross-sectional shape of the light from the light source 160 into a predetermined value (converts this cross-sectional shape, for example, from a rectangle into a square). The beam shaping optical system 182 forms a light beam having a size and an angle of divergence that are required to illuminate the multibeam generation unit 187.

The polarization control unit 183 uses, for example, a linear polarizer, and has a function of eliminating unnecessary polarized components. Minimizing the polarized components eliminated (shielded) by the polarization control unit 183 makes it possible to efficiently convert the light from the light source 160 into predetermined linearly polarized light.

The phase control unit 184 generates a phase difference of $\lambda/4$ in the light, which is linearly polarized by the polarization control unit 183, to convert it into circularly polarized light. The exit angle control optical element 185 uses, for example, an optical integrator (for example, a fly-eye lens or fiber formed from a plurality of microlenses), and outputs the light at a predetermined angle of divergence. The relay optical system 186 focuses the light emerging from the exit angle control optical element 185 on the multibeam generation unit 187. The exit surface of the exit angle control optical element 185 and the incident surface of the multibeam generation unit 187 have a Fourier transform relationship (serve as an object plane and a pupil plane, respectively, or serve as a pupil plane and an image plane, respectively) by means of the relay optical system 186. The multibeam generation unit 187 uses an optical integrator used to uniformly illuminate the polarization state adjusting unit 188 and computer generated hologram 189. A secondary light source formed from a plurality of point light sources is formed on the exit surface of the multibeam generation unit 187. The light emerging from the multibeam generation unit 187 enters the polarization state adjusting unit 188 as circularly polarized light.

The polarization state adjusting unit 188 generates a phase difference of $\lambda/4$ in the light, which is circularly polarized by the phase control unit 184, to convert it into linearly polarized light having a predetermined polarization direction. The light emerging from the polarization state adjusting unit 188 impinges on the computer generated hologram 189 which functions as a diffraction optical element. Although the polarization state adjusting unit 188 is placed on the light source side with respect to the computer generated hologram 189 in this embodiment, the polarization state adjusting unit 188 and the computer generated hologram 189 may be interchanged with each other. Also, when the polarization state adjusting unit 188 uses an SWS (Sub-Wavelength Structure), it serves as a single device having the functions of both a polarization state adjusting unit and a diffraction optical element (that is, it integrates a diffraction optical element).

The computer generated hologram 189 forms an effective light source (light intensity distribution) determined by the above-mentioned determination method, such as an effective light source as shown in FIG. 4, at the position of the aperture 191 via the relay optical system 190. The computer generated hologram 189 can also form, for example, annular illumination and quadrupole illumination, and even implement, for example, tangential polarization and radial polarization in cooperation with the polarization state adjusting unit 188. A plurality of computer generated holograms 189 which form different effective light sources are placed on, for example, a switching unit such as a turret. A computer generated hologram 189 corresponding to an effective light source determined by the above-mentioned determination method is placed in the optical path of the illumination optical system 180, thereby making it possible to form various effective light sources.

The aperture 191 has a function of passing only the effective light source (light intensity distribution) formed by the computer generated hologram 189. The computer generated hologram 189 and the aperture 191 have a Fourier transform relationship. The zoom optical system 192 enlarges the effective light source formed by the computer generated hologram 189 to a predetermined magnification, and projects it onto the multibeam generation unit 193. The multibeam generation unit 193 is placed on the pupil plane of the illumination optical system 180, and forms, on its exit surface, a light source image (effective light source) corresponding to the light intensity distribution formed at the position of the aperture 191. In this embodiment, the multibeam generation unit 193 uses an optical integrator such as a fly-eye lens or a cylindrical lens array. Note that the aperture stop 194 is placed near the exit surface of the multibeam generation unit 193. The irradiation unit 195 includes, for example, a condenser optical system, and illuminates the mask 120 with the effective light source formed on the exit surface of the multibeam generation unit 193.

The mask 120 includes a circuit pattern (main pattern) to be transferred, and auxiliary patterns. The mask 120 is supported and driven by the mask stage (not shown). Light diffracted by the mask 120 is projected onto the wafer 140 via the projection optical system 130. Since the exposure apparatus 100 is of the step-and-scan type, it transfers the pattern of the mask 120 onto the wafer 140 by scanning them.

The projection optical system 130 projects the pattern of the mask 120 onto the wafer 140. A dioptric system, a catadioptric system, or a catoptric system can be used as the projection optical system 130.

The wafer 140 is a substrate onto which the pattern of the mask 120 is to be projected (transferred), and is supported and driven by the wafer stage (not shown). However, the wafer 140 can also be substituted by a glass plate or another substrate. The wafer 140 is coated with a resist.

In exposure, light from the light source 160 illuminates the mask 120 by means of the illumination optical system 180. The light which bears the information of the pattern of the mask 120 forms an image on the wafer 140 by means of the projection optical system 130. At this time, the mask 120 is illuminated with an effective light source determined by the above-mentioned determination method. Hence, the exposure apparatus 100 can provide high-quality devices (for example, a semiconductor device, an LCD device, an image sensing device (for example, a CCD), and a thin-film magnetic head) with a high throughput and good economic efficiency. These devices are fabricated through a step of exposing a substrate (for example, a wafer or glass plate) coated with a photoresist (sensitizer) by using the exposure apparatus 100, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-196091 filed on Sep. 1, 2010, which is hereby incorporated by reference herein in its entirety.

What is claimed is:

1. A determination method of determining a light intensity distribution to be formed on a pupil plane of an illumination optical system which illuminates a mask in an exposure apparatus including the illumination optical system and a projection optical system which projects a pattern of the mask onto a substrate, the method, performing the following steps by a computer, comprising:
   a first step of setting the pattern of the mask;
   a second step of setting a cutline used to evaluate an image of the pattern of the mask, which is formed on an image plane of the projection optical system, and a target position of the image;
   a third step of setting a plurality of element light sources which form the light intensity distribution of the illumination optical system;
   a fourth step of calculating an image of the pattern of the mask, which is formed on the cutline upon illuminating the pattern of the mask, for each of the plurality of element light sources; and
   a fifth step of determining an intensity of the element light source such that a position of the image of the pattern of the mask on the cutline from the calculated image comes close to the target position, thereby determining the light intensity distribution.

2. The method according to claim 1, wherein
in the fifth step, mixed integer programming is used to determine the light intensity distribution such that the position of the image of the pattern of the mask on the cutline comes close to the target position,
the mixed integer programming uses a variable which takes a first integer value if an intensity of the image of the pattern of the mask exceeds a threshold, and takes a second integer value if the intensity of the image of the pattern of the mask does not exceed the threshold, and
the variable is set for each of positions of the images of the pattern of the mask, which are calculated in the fourth step.

3. The method according to claim 1,
wherein
in the fourth step, an image of the pattern of the mask formed at a position corresponding to the cutline set in the second step is calculated for each of a plurality of defocus planes defocused from the image plane of the projection optical system as well, and
in the fifth step, based on the image calculated for each of the plurality of defocus planes as well, the intensity distribution is determined such that the position of the image of the pattern of the mask on the cutline comes close to the target position on each of the plurality of defocus planes.

4. The method according to claim 1, wherein
the third step further includes a step of generating proportional-multiplication element light sources obtained by proportionally multiplying intensities of the plurality of element light sources by a given factor,
in the fourth step, an image of the pattern of the mask formed at a position corresponding to the cutline set in the second step is calculated for each of the proportional-multiplication element light sources and for each of the plurality of element light sources, and
in the fifth step, based on the image calculated for each of the proportional-multiplication element light sources and for each of the plurality of element light sources, the intensity of the element light source is determined such that the position of the image of the pattern of the mask on the cutline comes close to the target position, thereby determining the light intensity distribution.

5. The method according to claim 1, wherein
in the fourth step, an intensity of the image of the pattern of the mask is calculated for each of a first number of positions included in an edge region including an edge of the image, and
the method further comprises:
a sixth step of specifying the edge region including the edge of the image of the pattern of the mask, which is formed on the cutline upon illuminating the pattern of the mask with the light intensity distribution determined in the fifth step, thereby calculating, for each of the plurality of element light sources generated in the third step, an image of the pattern of the mask, which is formed on the cutline, so that the intensity of the image is calculated for each of a second number of positions larger than the first number of positions in the specified edge region; and a seventh step of determining, based on the images calculated in the sixth step, a weight to be applied to each of the plurality of element light sources such that the position of the image of the pattern of the mask on the cutline comes close to the target position, thereby determining, as the light intensity distribution to be formed on the pupil plane of the illumination optical system, a light source obtained by combining the plurality of element light sources applied with the weights.

6. The method according to claim 1, wherein in the fifth step, based on the image calculated in the fourth step, the light intensity distribution is determined such that the position of the image of the pattern of the mask on the cutline comes close to the target position, and a dimension, on the cutline, of the image of the pattern of the mask comes close to a target dimension value.

7. The method according to claim 1, wherein in the fifth step, the position of the image of the pattern of the mask on the cutline is obtained from the calculated image, and a weight to be applied to each of the plurality of element light sources is determined such that the obtained position comes close to the target position, thereby determining, as the light intensity distribution to be formed on the pupil plane of the illumination optical system, a light source obtained by combining the plurality of element light sources applied with the weights.

8. An exposure method comprising the steps of:
illuminating a mask with light emitted by an illumination optical system which forms a light intensity distribution determined using a determination method defined in claim 1; and projecting an image of a pattern of the mask onto a substrate via a projection optical system.

9. A computer-readable storage medium storing a program for causing a computer to execute a determination method of determining a light intensity distribution to be formed on a pupil plane of an illumination optical system which illuminates a mask in an exposure apparatus including the illumination optical system and a projection optical system which projects a pattern of the mask onto a substrate, the program causing the computer to execute:
a first step of setting the pattern of the mask;
a second step of setting a cutline used to evaluate an image of the pattern of the mask, which is formed on an image plane of the projection optical system, and a target position of the image;
a third step of setting a plurality of element light sources which form the light intensity distribution of the illumination optical system;
a fourth step of calculating an image of the pattern of the mask, which is formed on the cutline upon illuminating the pattern of the mask, for each of the plurality of element light sources; and
a fifth step of determining an intensity of the element light source such that a position of the image of the pattern of the mask on the cutline from the calculated image comes close to the target position, thereby determining the light intensity distribution.

10. The method according to claim 1, wherein the position of the image of the pattern of the mask on the cutline is the position of a predetermined point between edges of the image of the pattern of the mask on the cutline.

11. The method according to claim 10, wherein the predetermined point between edges is a midpoint between edges.

* * * * *